United States Patent [19]
Matsuoka et al.

[11] Patent Number: 5,976,918
[45] Date of Patent: Nov. 2, 1999

[54] METHOD OF FORMING INSULATING FILM WITH FEW HYDROGEN ATOM INCLUSIONS

[75] Inventors: Toshimasa Matsuoka, Yao; Masayuki Nakano; Satoshi Morishita, both of Tenri; Hiroshi Iwata, Nara-ken; Seizo Kakimoto, Nara-ken; Takashi Fukushima, Nara-ken, all of Japan

[73] Assignee: Sharp Kabushiki Kaisha, Osaka, Japan

[21] Appl. No.: 08/985,633

[22] Filed: Dec. 4, 1997

[30] Foreign Application Priority Data

Dec. 5, 1996 [JP] Japan ..................................... 8-324978

[51] Int. Cl.⁶ ............................ H01L 21/00; H01L 21/20
[52] U.S. Cl. ........................ 438/149; 438/151; 438/486; 438/487
[58] Field of Search .................... 438/149, 151, 438/486, 487

[56] References Cited

U.S. PATENT DOCUMENTS 5,256,810  10/1993  Rowe et al. ............................ 558/320
5,840,951  11/1998  Hierstetter et al. ..................... 556/425

FOREIGN PATENT DOCUMENTS 5-160114  6/1993  Japan .

OTHER PUBLICATIONS

X.W. Wang et al, Extending Gate Dielectric Scaling Limit by Use of Nitride or Oxynitride, 1995 Symposium on VLSI Technology Digest of Technical Papers, pp. 109–110, Month Unknown.

Hisayo Sasaki Momose et al, Tunneling Gate Oxide Approach to Ultra–High Current Drive in Small Geometry Mosfets, Research and Development Center, Toshiba Corp., pp. 25.1.1 to 25.1.4, 1994, Month Unknown.

*Primary Examiner*—John F. Niebling
*Assistant Examiner*—Michael S. Lebentritt
*Attorney, Agent, or Firm*—Birch, Stewart, Kolasch & Birch, LLP

[57] ABSTRACT

In accordance with the development of the fineness of MOSFETs, a gate insulating film and a capacitor insulating film are required to have a smaller thickness and a higher film quality. Accordingly, the present invention is intended to provide a method for forming a high-quality insulating film while preventing hydrogen atoms which cause a leak current and an electron trap from entering the insulating film. The present method uses a gas of molecules containing at least nitrogen, the gas is a compound which includes no oxygen atom and has no bond of a nitrogen atom and a hydrogen atom (N—H) and generates monoatomic nitrogen when the gas dissociates.

8 Claims, 18 Drawing Sheets

Triallylamine : N(C₃H₅)₃

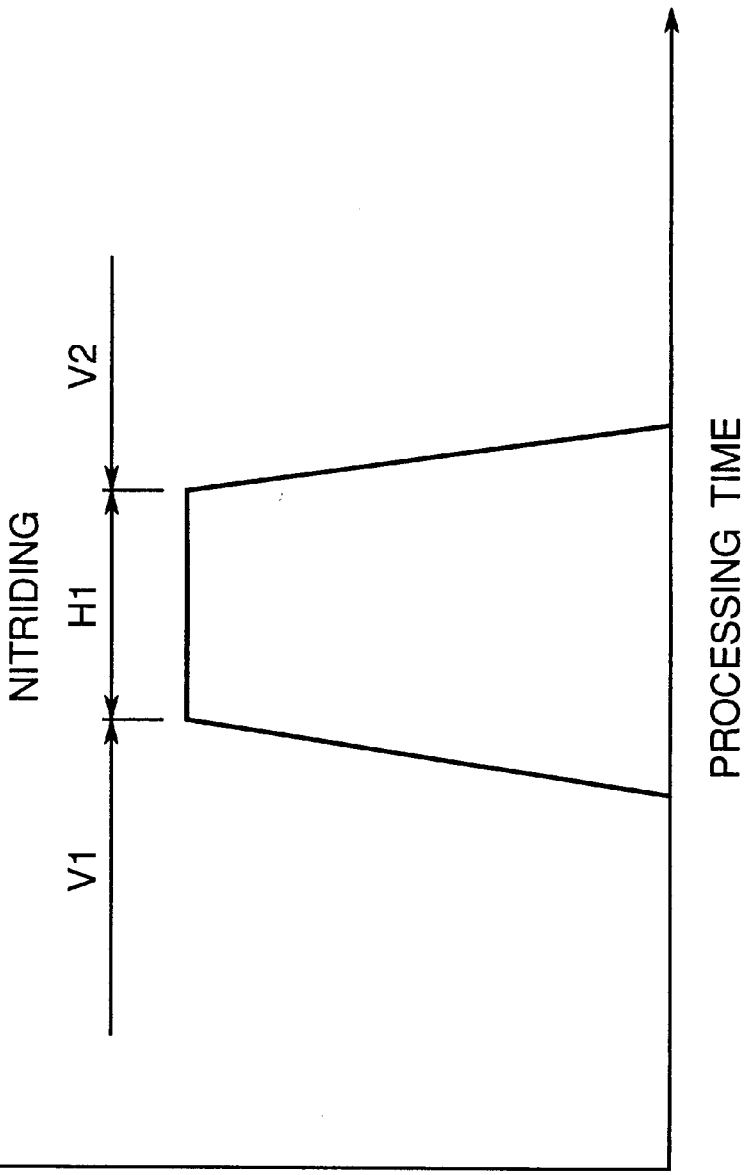

METHOD OF FORMING INSULATING FILM WITH FEW HYDROGEN ATOM INCLUSIONS

BACKGROUND OF THE INVENTION

The present invention relates to a method of forming an insulating film for use in a semiconductor electronic device, and in particular, to a method of forming an insulating film with few hydrogen atom inclusions for use in the gate of an insulated gate type field-effect transistor (FET).

Developing the fineness of MOS (Metal Oxide Semiconductor) FETs such as VLSI (Very Large Scale Integration)s largely depends on the progress of a technique for forming a gate insulating film that is thin and thermally stable. This is because the reliability and performance of the device largely depends on the characteristics of the gate insulating film. As a gate insulating film, silicon thermal-oxidation film ($SiO_2$) has been conventionally used. However, a high electric field on the order of MV/cm is normally applied to the gate oxide film, and therefore, a dielectric breakdown due to the high electric field, generation of a surface state due to a hot carrier and a characteristic deterioration due to carrier capture and so forth emerge as problems. In particular, the gate oxide films of the recent MOSFETs are required to have a very thin oxide film having a thickness of not greater than 10 nm, and the aforementioned problems become more serious. In the case of a gate oxide film having a thickness of not greater than 5 nm, not only the film quality is deteriorated by the influence of a natural oxide film but also film thickness control becomes hard to be achieved. As described above, the reduction in thickness of the gate oxide film is coming near the limit.

In an attempt to overcome the limit of the oxide film, a nitriding method with ammonia ($NH_3$) and an oxy-nitriding method with a compound gas of nitrogen and oxygen, such as nitrogen monoxide (NO), dinitrogen oxide ($N_2O$) or nitrogen dioxide ($NO_2$) have been examined. According to the former method, a nitrided oxide film having a finer structure than the oxide film is formed by heating an oxide film at a high temperature in an ammonia atmosphere, thereby improving a stress resistance. However, according to the method for executing nitriding with ammonia, a great quantity of hydrogen (H) is taken into the oxide film together with nitrogen (N), so that chemical species such as Si—H and Si—N—H are generated. These chemical species operate as an electron trap to vary the threshold voltage of MOSFET. This becomes a problem in terms of a long-term reliability of the device. As a method for suppressing the problem of ammonia with the effect of developing the fineness by nitrogen, a method for forming an oxy-nitrided film having a fine structure by heating an oxide film at a high temperature in an atmosphere of nitrogen monoxide (NO), dinitrogen oxide ($N_2O$), nitrogen dioxide ($NO_2$) or the like has been disclosed by Makoto Yasuda, Nagaru Fukuda et al. in the document of Japanese Patent Laid-Open Publication No. HEI 5-160114. This method can improve the stress resistance without increasing the chemical species such as Si—H and Si—N—H in the oxide film, and therefore, the method is regarded as being promising as a highly-reliable insulating film forming technique as compared with the former method using ammonia.

On the other hand, there has been an attempt to thin the gate oxide film of MOSFET for the purpose of increasing the operating speed and reducing the power consumption of VLSIs, where a gate leak due to direct tunneling becomes significant in the film thickness dimension of not greater than 3 nm. As a method for avoiding this, a method for reducing the gate area by developing the fineness has been reported by H. S. Momose et al. in International Electron Devices Meeting Technical Digest (Pages 593–597, 1994). A method for allowing the gate capacity to be large with a high-dielectric film such as a nitride film even when the insulating film thickness is great has been proposed, for example, by X. J. Wang et al. in VLSI Technology Symposium Digest (Pages 109–110, 1995).

However, in the case where a gate insulating film is oxy-nitrided by a compound gas atmosphere of nitrogen and oxygen, such as nitrogen monoxide (NO), dinitrogen oxide ($N_2O$) or nitrogen dioxide ($NO_2$) for ensuring the reliability of the gate insulating film, the oxidation and nitriding concurrently progress. Accordingly, there is not only the problem that the film thickness and intra-film nitrogen density cannot be independently controlled but also the problem that the film is hard to be nitrided since the intra-film nitrogen density is hard to be increased. When ammonia is used for the nitriding, a great quantity of hydrogen (H) is taken into the oxide film together with nitrogen (N), and consequently chemical species such as —H radical are generated. These chemical species operate as an electron trap to vary the threshold voltage of MOSFET. This has the problem that it degrades the long-term reliability of the device.

When the reduction in thickness of the gate oxide film progresses to a film thickness of not greater than 3 nm, a large gate capacity can be secured by using a nitride film while suppressing the gate leak due to the direct tunneling. However, nitriding with ammonia or CVD with ammonia and silane-based gas is used in this case, and this has led to the problem that a great quantity of hydrogen is taken into the film, forming a great quantity of electron traps and surface states. Particularly when a great quantity of electron traps exist, a current due to Poole-Frenkel conduction flows, and this has caused an increase in gate leak.

Not only the gate insulating film but also insulating films such as a capacitor insulating film have had the problem that the device characteristics are deteriorated by the leak current, electron trap, surface state and so forth.

SUMMARY OF THE INVENTION

Accordingly, it is an object of the present invention to provide a method for obtaining an insulating film which prevents hydrogen atoms from entering the insulating film, reducing the electron trap and surface state and reducing the leak current due to Poole-Frenkel conduction.

In order to achieve the aforementioned object, there is provided an insulating film forming method on a silicon substrate by means of a gas of molecules containing at least nitrogen, said gas of molecules containing nitrogen being a compound which includes no oxygen atom and has no bond between a nitrogen atom and a hydrogen atom (N—H) and being a gas which generates monoatomic nitrogen when it dissociates.

The gas is, for example, triallylamine (($c_3H_5)_3N$), ethylazide ($C_2H_5N_3$) or the like or these mixed with inert gas of nitrogen ($N_2$), argon (Ar) or the like.

According to the insulating film forming method of the first embodiment of the present invention, the gas of molecules containing nitrogen is including no oxygen atom, and therefore, the nitriding can be achieved as accompanied with no oxidation differently from the case where oxy-nitriding is executed with a compound gas atmosphere of nitrogen and oxygen, such as nitrogen monoxide (NO), dinitrogen oxide ($N_2O$) and nitrogen dioxide ($NO_2$). Furthermore, since the present gas of molecules containing nitrogen includes no bond between a nitrogen atom and a hydrogen atom (N—H), the inclusion of hydrogen atoms in the insulating film attended by the nitriding can be reduced differently from the nitriding with ammonia. As a result, a small quantity of electron traps and surface states result and the current due to the Poole-Frenkel conduction mechanism can be reduced. Furthermore, by forming the nitride film on the silicon substrate by this nitriding method without forming a gate oxide film thinner than 3 nm which causes direct tunneling, a large gate capacity is ensured while suppressing the gate leak, allowing the current drive ability of the MOSFET to be improved.

Also, there is provided an insulating film forming method, wherein said gas of molecules containing nitrogen is at least either amine or azide.

Also, there is provided an insulating film forming method, wherein said amine is triallylamine.

This triallylamine (($C_3H_5)_3N$) has a structure shown in FIG. 1. A result of mass spectrometry of dissociation of the triallylamine at a temperature of 300° C. is shown in FIG. 2. This figure shows that the bond between a nitrogen atom and a carbon atom (N—C) is easy to dissociate and a monoatomic nitrogen atom is generated.

Also, there is provided an insulating film forming method, wherein said azide is ethylazide.

Ethylazide causes the following dissociating reaction at an elevated temperature.

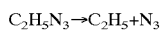

Through this dissociating reaction, a monatomic nitrogen (N) is generated. The present gas of molecules containing nitrogen is not the alkaline metallic salt, and therefore, no alkaline metal enters the insulating film.

These gases have no bond between a nitrogen atom and a hydrogen atom (N—H), and the hydrogen atom is taken into the produced organic matter, and therefore, only a small quantity of hydrogen atom can enter the insulating film concurrent with the nitriding differently from the nitriding with ammonia.

According to the insulating film forming methods of the second, third and fourth embodiments of the present invention, amine or azide is used as the gas of molecules containing nitrogen which generates the aforementioned monoatomic nitrogen of the first embodiment. In this case, the monoatomic nitrogen generated by the thermal dissociation of the gas of molecules containing nitrogen of amine causes nitriding, which is advantageous. In particular, it is preferable to use triallylamine (($C_3H_5)_3N$) as amine and use ethylazide ($C_2H_5N_3$) as azide for the second embodiment. Since ethylazide is not the alkaline metallic salt, the mobile charges formed by the inclusion of an alkaline metal into the insulating film can be eliminated.

Also, there is provided an insulating film forming method, wherein said gas of molecules containing nitrogen is used at a reduced pressure.

According to the insulating film forming method of the fifth embodiment of the present invention, by using the gas of molecules containing nitrogen at a reduced pressure, the thermal dissociation of the aforementioned gas of molecules containing nitrogen is promoted and the lifetime of the generated atomic nitrogen is prolonged, allowing the nitriding to be efficiently executed. Furthermore, even if a substance generated by the thermal dissociation of the aforementioned gas of molecules containing nitrogen, or in particular, an organic matter is adhered to the silicon substrate surface, it can be easily removed. In the case where the aforementioned gas of molecules containing nitrogen is a liquefied gas such as triallylamine, it can be directly introduced into the reaction tube by making a reduced pressure lower than the vapor pressure. With the above arrangement, the efficiency of nitriding (the quantity of gas necessary for obtaining a desired thickness) is improved, and the adhesion of the organic matter to the wafer surface can be suppressed.

Also, there is provided an insulating film forming method, wherein said gas of molecules containing nitrogen is liquid at normal temperature and normal pressure and is supplied by bubbling an inert gas in said liquid.

According to the insulating film forming method of the sixth embodiment of the present invention, the nitriding process can be achieved either at a pressure not lower than the vapor pressure of the gas or at a normal pressure, allowing a simple oxidation and nitriding reaction chamber requiring no high-vacuum chamber to be provided.

Also, there is provided an insulating film forming method, wherein a nitride film is formed on the silicon substrate by means of said gas of molecules containing nitrogen and thereafter thermally treated in an atmosphere including an oxidative gas.

According to the insulating film forming method of the seventh embodiment of the present invention, the dangling bonds of the nitrogen atoms in the nitride film can be reduced by oxidation. Furthermore, an oxide film is formed at the interface between the nitride film and the silicon substrate, and therefore, the interface between the silicon substrate and the insulating film can be made satisfactory. Therefore, the electron traps and the surface states in the nitride film can be further reduced, and the leak current due to the Poole-Frenkel conduction mechanism can be further reduced. Furthermore, when a gas of molecules containing organic compound-based nitrogen is used, the organic matter that has been generated from the organic compound-based gas and adhered to the silicon substrate can be also removed. With this arrangement, when forming, for example, a gate electrode, the inclusion of any organic matter in the vicinity of the interface between the gate electrode and the gate insulating film can be prevented.

Also, there is provided an insulating film forming method, wherein an oxide film is formed by oxidizing a surface of the silicon substrate and thereafter thermally treated in an atmosphere including said gas of molecules containing nitrogen.

According to the insulating film forming method of the eighth embodiment of the present invention, a nitrided film is formed between the oxide film and the silicon substrate, and a small quantity of hydrogen exists in the nitrided film. Therefore, an oxy-nitrided film having a small quantity of electron traps and surface states can be formed. Furthermore, since the oxidation and nitriding are executed in separate processes, the film thickness and the nitrogen density can be independently controlled and the nitrogen density can be increased.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 11 is an explanatory graph of a heating cycle of the first embodiment of the insulating film forming method of the present invention;

DETAILED DESCRIPTION OF THE PREFERRED EMBODIMENTS

Preferred embodiments of the insulating film forming method of the present invention will be described in detail below with reference to the accompanying drawings. It is to be noted that the figures used for explanation merely schematically show the sizes, shapes and arrangements of the components to the extent of allowing the present invention to be understood.

Figure 19:
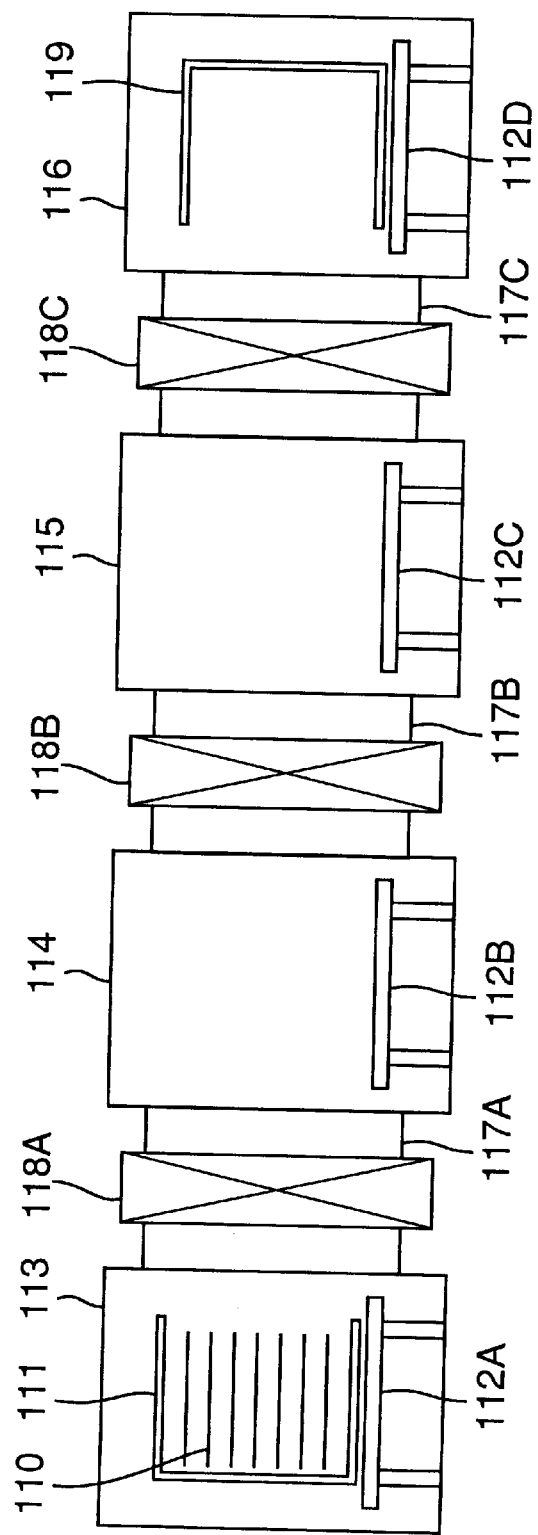
FIG. 19 is a schematic view of an apparatus for implementing the insulating film forming method of the present invention.

First, a preferable apparatus for implementing the method of the present invention will be described. FIG. 19 shows a schematic view of an insulating film forming apparatus. This apparatus has a preprocessing cassette room 113, a cleaning room 114, an oxidation and nitriding chamber 115 and a postprocessing cassette room 116. The preprocessing cassette room 113 and the postprocessing cassette room 116 are respectively provided with stages 112A and 112D for transposing or retaining the respective carriers 111 and 119. The cleaning room 114 and the oxidation and nitriding chamber 115 are respectively provided with stages (or wafer holders) 112B and 112C for transposing or retaining wafers 110. The preprocessing cassette room 113, cleaning room 114, oxidation and nitriding chamber 115 and postprocessing cassette room 116 are connected in series via passages 117A, 117B and 117C. The passages 117A, 117B and 117C are mounted with valves 118A, 118B and 118C which can interrupt the respective passages so that the pressures and atmospheres inside the preprocessing cassette room 113, cleaning room 114, oxidation and nitriding chamber 115 and postprocessing cassette room 116 can be independently controlled. It is to be noted that this apparatus may process the wafers 110 either one by one or every several ones.

The preprocessing cassette room 113 is opened with the valve 118A closed, and the wafer 110 is placed inside the preprocessing cassette room 113 as put in the carrier 111. In the above state, the atmosphere inside the room is replaced by an inert gas such as nitrogen gas ($N_2$) or argon gas (Ar) or evacuated to a high vacuum so as to be an atmosphere in which oxygen and moisture are reduced as far as possible (concretely an atmosphere having a molecular density of not greater than $10^{12}$ $cm^{-3}$ or preferably not greater than $10^{11}$ $cm^{-3}$). The atmosphere inside the cleaning room 114 is replaced by an inert gas such as nitrogen gas ($N_2$) or argon gas (Ar) or evacuated to a high vacuum so as to be an atmosphere in which oxygen and moisture are reduced as far as possible (concretely an atmosphere having a molecular density of not greater than $10^{12}$ $cm^{-3}$ or preferably not greater than $10^{11}$ $cm^{-3}$), and thereafter the wafer 110 placed in the preprocessing cassette room 113 is transferred into the cleaning room 114 via the passage 117A. In the cleaning room 114 is executed wet or dry cleaning, so that the silicon surface of the wafer 110 is made clean and free of any natural oxide film. The cleaning room 114 is made to internally have an inert gas atmosphere in the case of wet cleaning or normal-pressure dry cleaning, and therefore, the atmosphere inside the preprocessing cassette room 113 has also been preparatorily replaced by an inert gas. The cleaning room 114 is internally made vacuous in the case of low-pressure dry cleaning, and therefore, the preprocessing cassette room 113 has also been preparatorily made vacuous.

After the cleaning process, the wafer 110 is transferred to the oxidation and nitriding chamber 115 via the passage 117B. Therefore, prior to the transfer, the atmosphere inside the oxidation and nitriding chamber 115 has been preparatorily replaced by an inert gas such as nitrogen gas or argon gas or evacuated to a high vacuum so as to be an atmosphere in which oxygen and moisture are reduced as far as possible (concretely an atmosphere having a molecular density of not greater than $10^{12}$ $cm^{-3}$ or preferably not greater than $10^{11}$ $cm^{-3}$). By making the cleaning room 114 and the oxidation and nitriding chamber 115 internally have an atmosphere of an inert gas such as nitrogen gas ($N_2$) or argon gas (Ar) or a high vacuum, the wafer 110 which is clean and free of any natural oxide film can be accommodated in the oxidation and nitriding chamber 115 without being exposed to the aerial atmosphere. The oxidation and nitriding chamber 115 may be either a resistance heating type furnace or a lamp heating system apparatus and is internally provided with an oxidation and nitriding use reaction tube. Further, when the oxidation and nitriding chamber 115 is the one which processes the wafers one by one, the chamber volume is small, and therefore, the change of atmosphere can be achieved at high speed, thereby improving the film thickness controllability. Further, the oxidation and nitriding chamber 115 can execute oxidation and nitriding even at a low pressure. As a gas of molecules containing nitrogen for executing the nitriding, triallylamine is used in the present embodiment. Triallylamine is a liquefied gas (having a boiling point at a temperature of 155° C. in the normal state), and therefore, by bubbling the nitrogen gas ($N_2$), argon gas (Ar) or the like, triallylamine is introduced into the reaction tube at a pressure not smaller than the normal pressure or its vapor pressure. Triallylamine is vaporized when a nitride film is formed at a low pressure of not greater than 100 Pa, and therefore, triallylamine gas itself can be introduced. Other than triallylamine, it is acceptable to use monomethyldiallylamine $(C_3H_5)_2N$—$CH_3$ or dimethylmonoallylamine $(C_3H_5)_2N$—$C_3H_5$ as amine or to use generic alkylamine as the gas of molecules containing nitrogen. It is generally acceptable to use the gas of molecules containing nitrogen such as alkylazide as azide in addition to ethylazide $C_2H_5N_3$. Each of these gases of molecules containing nitrogen described as above has a tendency of being a liquefied gas which is liquid at the normal temperature and normal pressure as the molecular weight is increased.

After the oxidation and nitriding process, the wafer 110 is transferred to the postprocessing cassette room 116 via the passage 117C. The wafer 110 is taken out in a state in which the valve 118C is closed and the postprocessing cassette room 116 is put at the normal pressure. The present apparatus executes the processes up to the oxidation and nitriding process, however, the present invention is not limited to this. By providing a chamber for CVD (Chemical Vapor Deposition) via a passage having a valve between the oxidation and nitriding chamber 115 and the postprocessing cassette room 116, a continuous process up to gate electrode formation can be achieved without exposing the wafer 110 to the aerial atmosphere.

By using the present apparatus, the wafer 110 can be introduced into the oxidation and nitriding use reaction tube with the silicon surface kept clean. Therefore, a gate insulating film free from the natural oxide film can be formed.
(First Embodiment)

Figure 1:
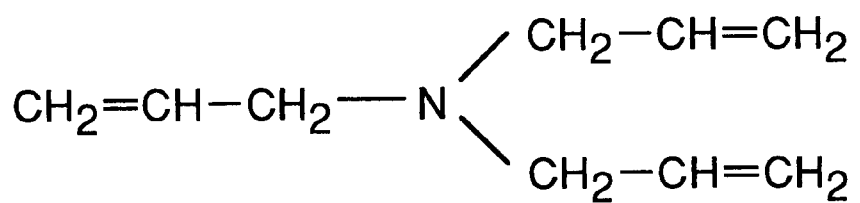
FIG. 1 is the structural formula of triallylamine used in the present invention.
Figure 2:
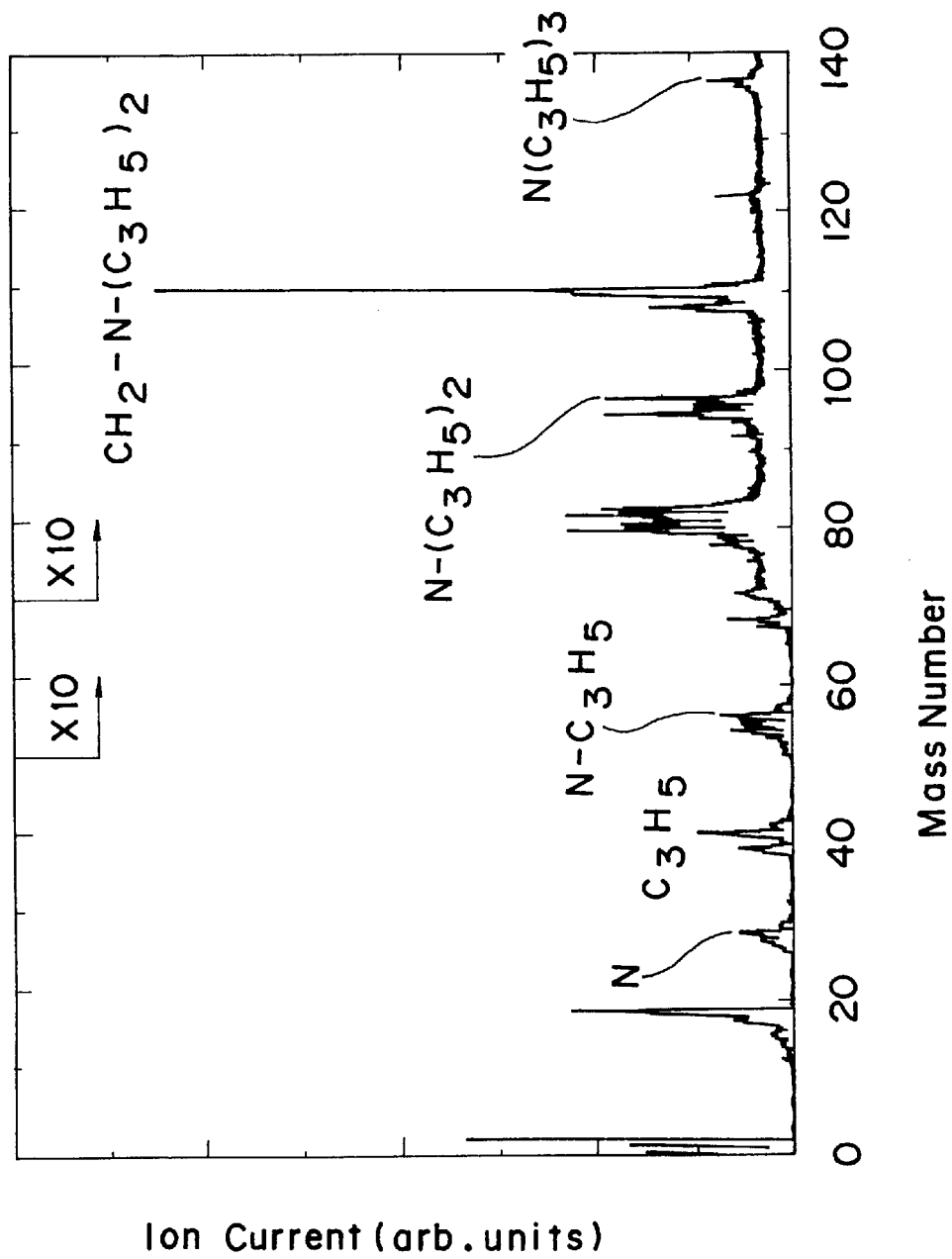
FIG. 2 is a graph showing a result of mass spectrometry of the dissociation reaction of triallylamine at a temperature of 300° C.
Figure 3:
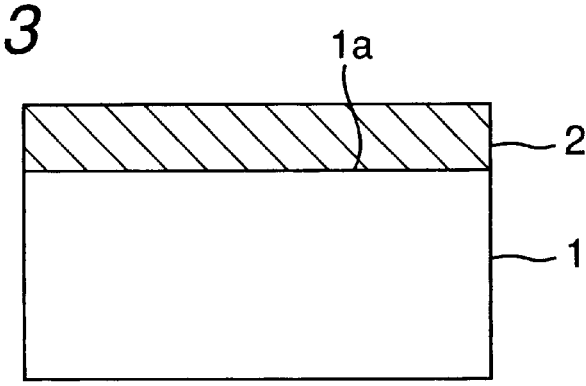
FIG. 3 is a view showing a forming process according to a first embodiment of the insulating film forming method of the present invention.

A case where a first embodiment of the insulating film forming method of the present invention is applied to the insulating film of a gate electrode will be described. FIGS. 3 and 11 show a process chart and an explanatory graph of a heating cycle for explaining the insulating film forming method of the present embodiment. In FIG. 11, the heating cycle is shown with an intra-furnace temperature or wafer temperature plotted along the axis of ordinates and a processing time plotted along the axis of abscissas. In the present embodiment, a resistance heating type furnace or a lamp heating system apparatus is used.

By cleaning a silicon substrate 1 in the cleaning room 114 (See FIG. 19), its surface is made clean and free of any natural oxide film. Subsequently, by replacing the atmosphere in the cleaning room with an inert gas such as nitrogen gas ($N_2$) or argon gas (Ar) or forming a high vacuum of $10^{-4}$ to $10^{-6}$ Pa, the silicon substrate 1 is transferred in an oxygen and moisture extremely reduced atmosphere and then placed in an oxidation and nitriding use reaction tube of the chamber 115 kept in the oxygen and moisture extremely reduced atmosphere, wherein the reduction of oxygen and moisture is previously performed by replacing the atmosphere with an inert gas such as nitrogen gas ($N_2$) or argon gas (Ar) or forming a high vacuum of $10^{-4}$ to $10^{-6}$ Pa.

Next, the substrate is raised in temperature (corresponding to V1 in FIG. 11) in the above atmosphere. Through this process, oxidation during temperature elevation is suppressed and a silicon surface which is clean and free of any natural oxide film can be maintained. Subsequently, the intra-furnace temperature is raised to a temperature of 700 to 900° C. in the case of the resistance heating type furnace or the wafer temperature is raised to a temperature of 700 to 1100° C. in the case of the lamp heating system apparatus, and triallylamine or this mixed with inert gas such as nitrogen gas ($N_2$) or argon gas (Ar) is introduced into the reaction tube (corresponding to H1 in FIG. 11). Through this process, a monoatomic nitrogen is generated by thermal dissociation, so that the surface of the silicon substrate 1 is nitrided. Since no natural oxide film exists prior to the nitriding, a nitride film 2 having a satisfactory film thickness uniformity is formed by this nitriding as shown in FIG. 3. In the case where only triallylamine is vaporized and introduced, the above process is executed at a low pressure of not greater than 100 Pa. In this case, because of the low pressure, the dissociation of triallylamine is promoted and the monoatomic nitrogen has a long lifetime, allowing the nitriding to be efficiently executed. Further, elimination of an organic matter which has been produced through the dissociating reaction of triallylamine and adhered to the wafer is also promoted. Mainly, by adjusting the time, temperature and pressure of the present nitriding process, a desired film thickness is obtained. After completing this nitriding process, the atmosphere is replaced by an inert gas such as nitrogen gas ($N_2$) or argon gas (Ar), and thereby the wafer is lowered in temperature (corresponding to V2 in FIG. 11) in the atmosphere in which oxygen and moisture are reduced as far as possible. Through the above processes, the nitride film 2 is formed on the silicon substrate surface.

According to the present insulating film forming method, there is a small quantity of hydrogen atoms in the nitride film differently from the nitriding by ammonia, and therefore, a small quality of electron traps and surface states result. At the same time, the gate leak due to the Poole-Frenkel conduction mechanism is also suppressed. Even when it is required to reduce the thickness of the gate oxide film to such an extent that the gate oxide film thickness will reach the direct tunneling region (oxide film thickness: not greater than 3 nm), since the dielectric constant of the nitride film is higher than that of the oxide film, the film thickness of the gate insulating film constructed of a nitride film can be made thick. Therefore, by using such a nitride film having a satisfactory quality, the gate leak can be suppressed. Furthermore, the film can be used as a capacitor insulating film or the like in which the leak current and electron trap come into question.
(Second Embodiment)

Figure 4A:
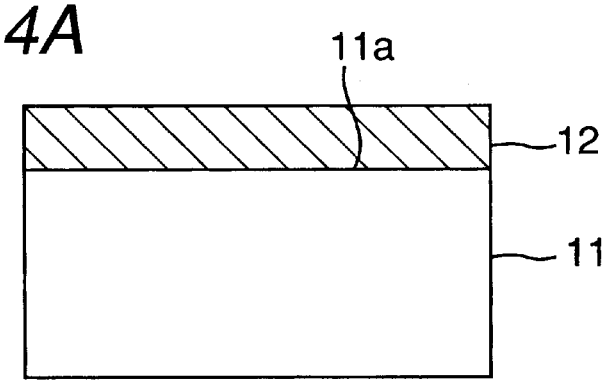
FIG. 4 is a view showing a forming process according to a second embodiment of the insulating film forming method of the present invention.
Figure 4B:
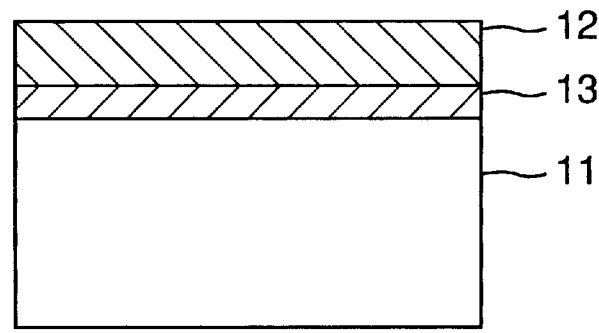
Figure 12:
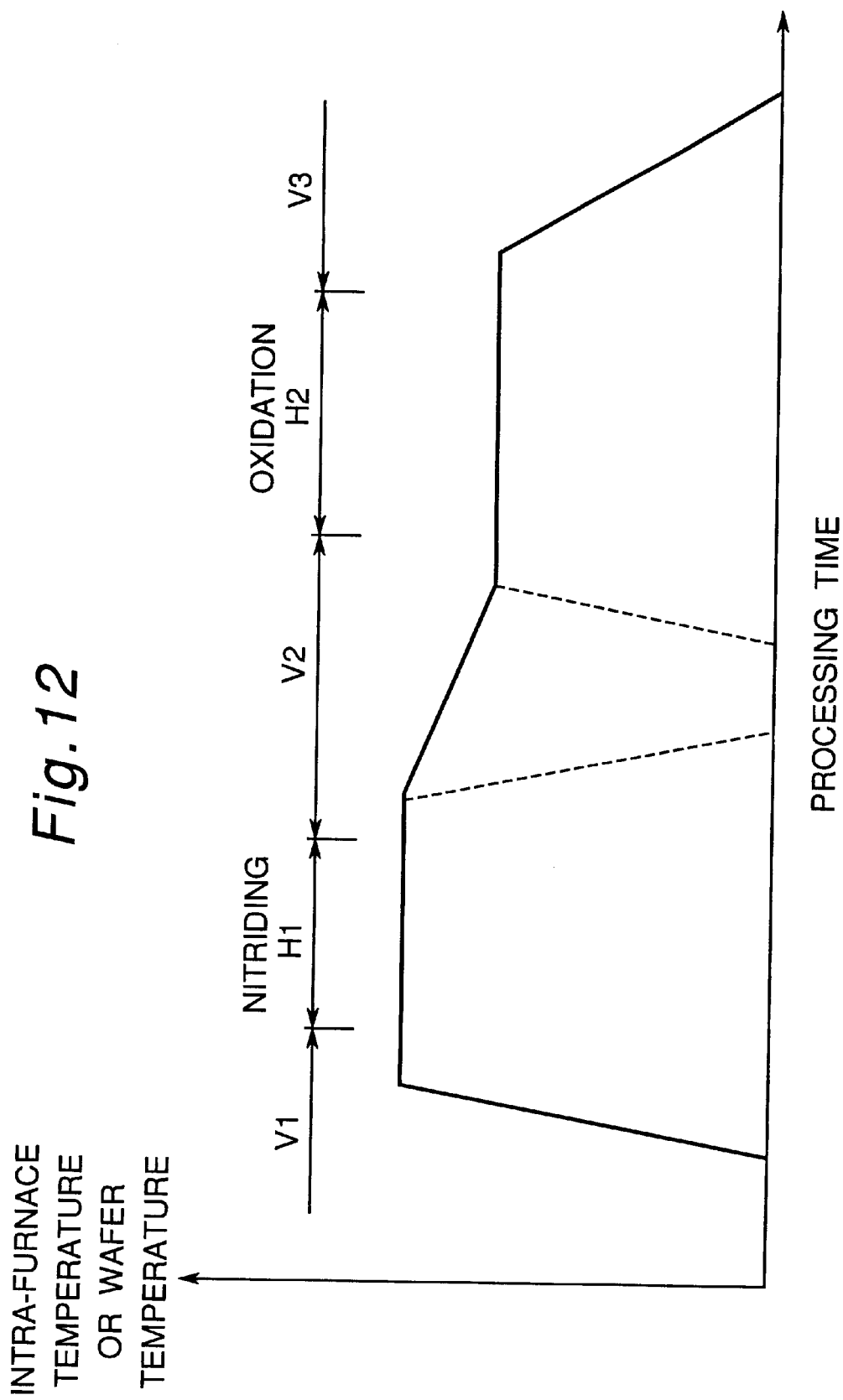
FIG. 12 is an explanatory graph of a heating cycle of the second embodiment of the insulating film forming method of the present invention.

A second embodiment of the insulating film forming method of the present invention will be described. FIGS. 4A and 4B and FIG. 12 show a process chart and an explanatory graph of a heating cycle for explaining the insulating film forming method of the present embodiment. In FIG. 12, the heating cycle is shown with an intra-furnace temperature or wafer temperature plotted along the axis of ordinates and a processing time plotted along the axis of abscissas. In the present embodiment, a resistance heating type furnace or a lamp heating system apparatus is used. It is to be noted that the oxidized film described in the present embodiment is defined as a film (SiON) which is formed through the reaction of oxide species in the vicinity of the interface between the silicon substrate and the nitride film and includes a great quantity of nitrogen and oxygen.

By cleaning a silicon substrate 11 in the cleaning room 114 (See FIG. 19), its surface is made clean and free of any natural oxide film. Subsequently, by replacing the atmosphere in the cleaning room with an inert gas such as nitrogen gas ($N_2$) or argon gas (Ar) or forming a high vacuum of $10^{-4}$ to $10^{-6}$ Pa, the silicon substrate 11 is transferred in an oxygen and moisture extremely reduced atmosphere and then placed in an oxidation and nitriding use reaction tube of the chamber 115 kept in the oxygen and moisture extremely reduced atmosphere, wherein the reduction of oxygen and moisture is previously performed by replacing the atmosphere with an inert gas such as nitrogen gas ($N_2$) or argon gas (Ar) or forming a high vacuum of $10^{-4}$ to $10^{-6}$ Pa.

Next, the substrate is raised in temperature (corresponding to V1 in FIG. 12) in the above atmosphere. Through this process, oxidation during temperature elevation is suppressed and a silicon surface which is clean and free of any natural oxide film can be maintained. Subsequently, the intra-furnace temperature is raised to a temperature of 700 to 900° C. in the case of the resistance heating type furnace or the wafer temperature is raised to a temperature of 700 to 1100° C. in the case of the lamp heating system apparatus, and triallylamine or this mixed with inert gas such as nitrogen gas ($N_2$) or argon gas (Ar) is introduced into the reaction tube (corresponding to Hi in FIG. 12). Through this process, a monoatomic nitrogen is generated by thermal dissociation, so that the surface of the silicon substrate 11 is nitrided. Since the natural oxide film on the silicon substrate is suppressed prior to the formation of the nitride film, the nitride film 12 having a satisfactory film thickness uniformity is formed as shown in FIG. 4A through this nitride film forming process. In the case where only triallylamine is vaporized and introduced, the above process is executed at a low pressure of not greater than 100 Pa. In this case, because of the low pressure, the dissociation of triallylamine is promoted and the monoatomic nitrogen has a long lifetime, allowing the nitriding to be efficiently executed. Further, elimination of an organic matter which has been produced through the dissociating reaction of triallylamine and adhered to the wafer is also promoted. Mainly, by adjusting the time, temperature and pressure of the present nitriding process, a desired film thickness is obtained.

After completing this nitride film forming process, the oxidation and nitriding use reaction tube is again made to internally have an atmosphere of an inert gas such as nitrogen gas ($N_2$) or argon gas (Ar), and thereafter the substrate is raised or lowered in temperature (corresponding to the solid line in V2 in FIG. 12) to the intra-furnace temperature of the subsequent oxidation process in the case of the resistance heating type furnace or lowered in temperature by air-cooling and then raised in temperature to the wafer temperature of the subsequent oxidation process (corresponding to the dashed lines in V2 in FIG. 12) in the case of the lamp heating system apparatus. After the intra-furnace temperature or the wafer temperature is thus set to a temperature of 600 to 1000° C., the nitride film 12 is subjected to an oxidation process in an atmosphere of an oxidative gas such as oxygen or ozone or this mixed with inert gas such as nitrogen gas ($N_2$) or argon gas (Ar), thereby forming an oxidized film 13 (having a film thickness of 0.5 to 1 nm) in the vicinity of an interface 11a between the silicon substrate 11 and the nitride film 12 as shown in FIG. 4B. Through this process, oxygen is bonded to the dangling bond of the nitrogen atom in the nitride film 12, thereby forming the oxidized film 13, so that the interfacial state of the interface 11a between the insulating film and the silicon substrate 11 can be made approximately the same as that of the $Si/SiO_2$ interface. This arrangement can reduce the electron traps and surface state as well as the current due to the Poole-Frenkel conduction mechanism. It is to be noted that the film thickness of the oxidized film 13 is appropriate for causing this effect. By virtue of the thermal dissociation of triallylamine in the nitride film forming stage, the organic matter adhered to the wafer surface is oxidized and allowed to be removed. This arrangement can prevent the inclusions of any organic matter in the vicinity of the interface between the gate electrode and the gate insulating film in forming the gate electrode by CVD or the like after the formation of the gate insulating film.

After completing this oxidation, the atmosphere is replaced with an inert gas such as nitrogen gas ($N_2$) or argon gas (Ar), and thereby the substrate is lowered in temperature (corresponding to V3 in FIG. 12) in an oxygen and moisture extremely reduced atmosphere. Through the above processes, an insulating film is formed on the silicon surface.

According to the present insulating film forming method, there is a small quantity of hydrogen atoms in the nitride film differently from the nitriding by ammonia, and therefore, a small quantity of electron traps and surface states result. Further, since the dangling bond of the nitrogen atom is bonded to oxygen because of oxidation of the nitride film 12, the electron traps are reduced further than in the first embodiment. Since the oxidized film 13 is formed in the vicinity of the interface between the nitride film 12 and the silicon substrate 11, the surface states can be further reduced. At the same time, the gate leak due to the Poole-Frenkel conduction mechanism is also suppressed. Even when it is required to reduce the thickness of the gate oxide film to such an extent that the gate oxide film thickness will reach the direct tunneling region (oxide film thickness: not greater than 3 nm), since the dielectric constant of the nitride film is higher than that of the oxide film, the film thickness of the gate insulating nitride film can be made thick. Therefore, by using such a nitride film having a satisfactory quality, the gate leak can be suppressed.

(Third Embodiment)

Figure 5A:
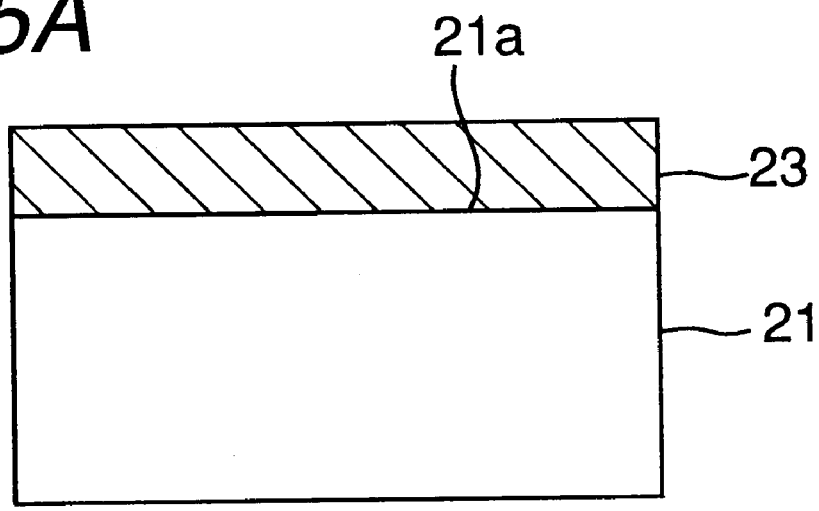
FIG. 5 is a view showing a forming process according to a third embodiment of the insulating film forming method of the present invention.
Figure 5B:
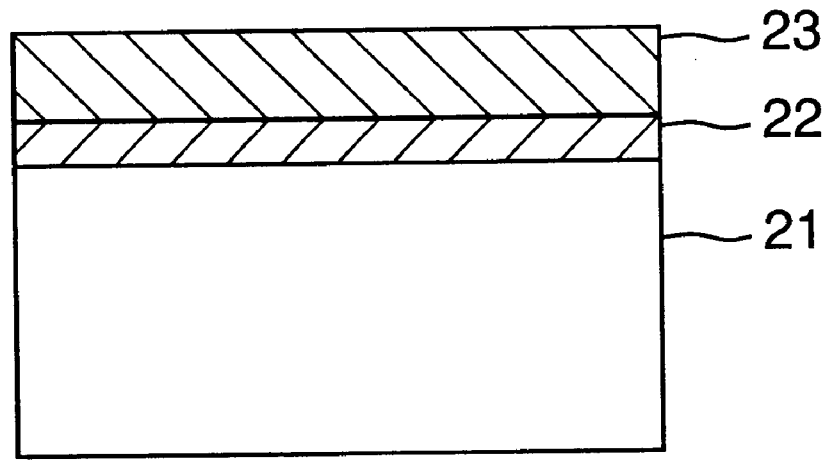
Figure 13:
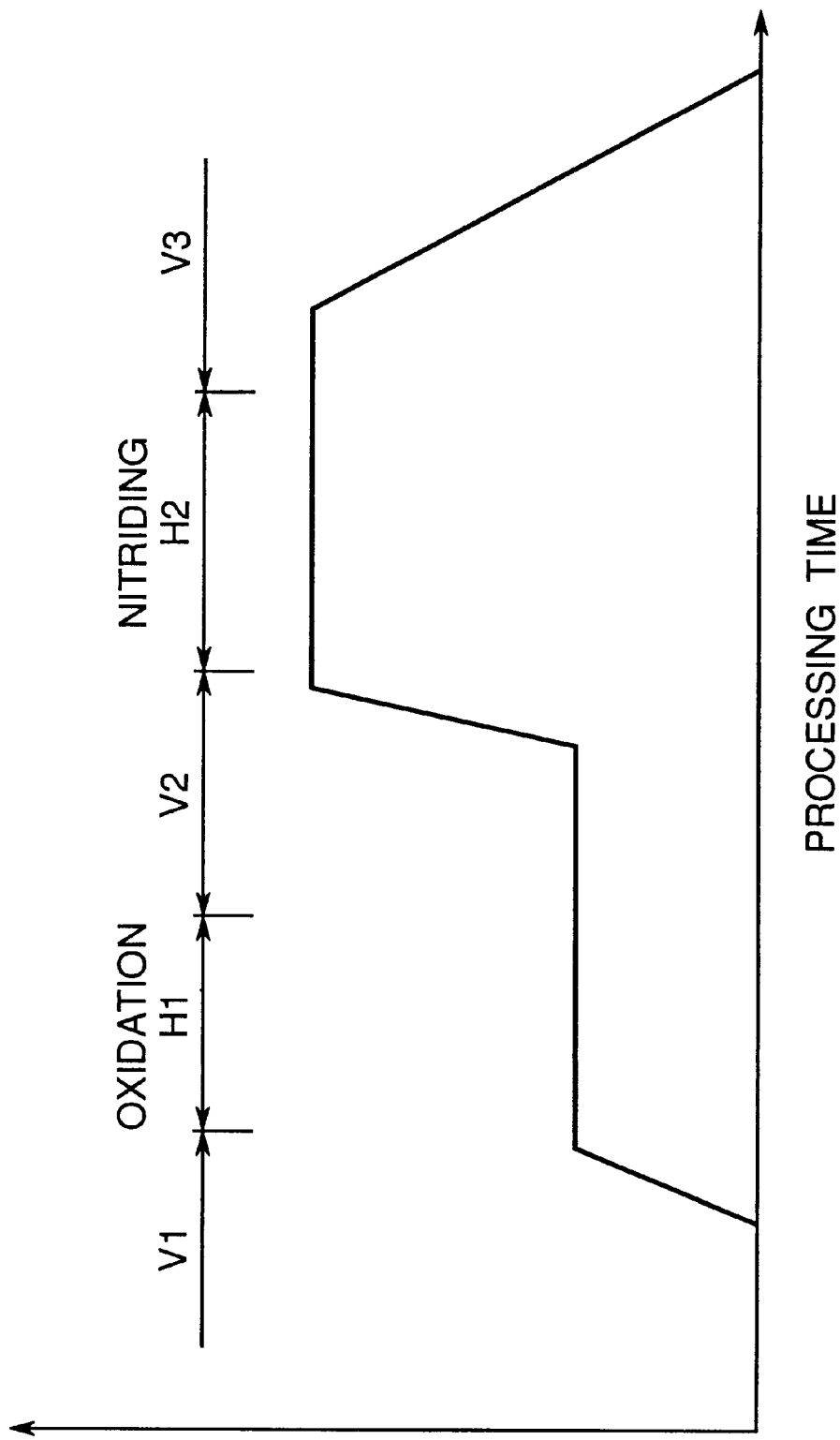
FIG. 13 is an explanatory graph of a heating cycle of the third embodiment of the insulating film forming method of the present invention.

A third embodiment of the insulating film forming method of the present invention will be described. FIGS. 5A and 5B and FIG. 13 show a process chart and an explanatory graph of a heating cycle for explaining the insulating film forming method of the present embodiment. The present embodiment uses a resistance heating type furnace, and the heating cycle is shown with an intra-furnace temperature plotted along the axis of ordinates and a processing time plotted along the axis of abscissas. It is to be noted that the nitrided film described in the present embodiment is defined as a film (SiON) which is formed through the reaction of nitride species in the vicinity of the interface between the silicon substrate and the oxide film and includes a great quantity of nitrogen and oxygen.

By cleaning a silicon substrate 21 in the cleaning room 114 (See FIG. 19), its surface is made clean and free of any natural oxide film. Subsequently, by replacing the atmosphere in the cleaning room with an inert gas such as nitrogen gas ($N_2$) or argon gas (Ar) or forming a high vacuum of $10^{-4}$ to $10^{-6}$ Pa, the silicon substrate 21 is transferred in an oxygen and moisture extremely reduced atmosphere and then placed in an oxidation and nitriding use reaction tube of the chamber 115 kept in the oxygen and moisture extremely reduced atmosphere, wherein the reduction of oxygen and moisture is previously performed by replacing the atmosphere with an inert gas such as nitrogen gas ($N_2$) or argon gas (Ar) or forming a high vacuum of $10^{-4}$ to $10^{-6}$ Pa.

Next, the substrate is raised in temperature (corresponding to V1 in FIG. 13) in the above atmosphere. Through this process, the formation of a natural oxide film having a degraded film quality due to the oxidation in the temperature raising stage is suppressed and a silicon surface which is clean and free of any natural oxide film can be maintained. Subsequently, the wafer which has the silicon surface being clean and free of any natural oxide film is introduced into the oxidation and nitriding use reaction tube and is oxidized by an oxidative gas at a temperature of 600 to 900° C. (corresponding to H1 in FIG. 13), thereby forming an oxide film 23 as shown in FIG. 5A. Particularly, by executing this process at a low pressure of not greater than 1 Pa, the wafer can be lamellarly oxidized one atomic layer by one atomic layer. Further, by providing the oxidative gas by moisture vapor ($H_2O$), ozone ($O_3$) or these gases mixed with oxygen gas ($H_2O/O_2$, $O_3/O_2$), the oxygen atom generated through the dissociation of $O_3$ molecule or $H_2O$ molecule itself is used as the oxide species with a small particle diameter as compared with the $O_2$ molecule. By virtue of the existence of the oxide species having a small particle diameter, the oxide film 23 obtained through the present oxidation process becomes dense and has an interfacial flatness as compared with the case where the film is formed by only oxygen molecules. Since the oxidizing rate is great in these atmospheres, it is better to execute the oxidation at a low pressure of not greater than 1 Pa for the lamellar oxidation. The oxide film 23 formed through the oxidation described as above has a small variation in film thickness and a smooth interface. With this arrangement, variations in film thickness and nitrogen density in the nitriding process as described later can be reduced. It is to be noted that the desired total insulating film thickness is mainly obtained by adjusting the pressure and time in this oxide film forming stage.

Subsequent to this oxidation process, the atmosphere is replaced by an inert gas such as nitrogen gas ($N_2$) or argon gas (Ar), and the wafer is raised in temperature (corresponding to V2 in FIG. 13) in an oxygen and moisture extremely reduced atmosphere. Through this process, even a slight oxidation is suppressed, and therefore, not only the subsequent variations in film thickness and nitrogen density can be reduced but also the inclusion of hydrogen atoms in the present insulating film are suppressed. Therefore, the possible occurrence of the deterioration of the device such as a surface state and an electron trap attributed to the hydrogen is also suppressed. Subsequently, triallylamine or this mixed with an inert gas of nitrogen, argon or the like is introduced into the reaction tube at a temperature of 700 to 1000° C. (corresponding to H2 in FIG. 13). Through this process, a monoatomic nitrogen is generated by the thermal dissociation, so that a nitrided film 22 (having a film thickness of 0.5 to 3 nm) is formed in the vicinity of an interface 21a between the oxide film 23 and the silicon substrate 21 as shown in FIG. 5B. The film thickness of the nitrided film 22 is adjusted so that a stress at the interface between the insulating film and the silicon substrate 21 is suitable, and the increase of hole traps and the reduction in carrier mobility are suppressed. The variation in film thickness is small and the interface is smooth prior to the nitriding process, and therefore, the nitrided film 22 has small variations in film thickness and nitrogen density. In the case where only triallylamine is vaporized and introduced, the process is executed at a low pressure of not greater than 100 Pa. In this case, because of the low pressure, the dissociation of triallylamine is promoted and the monoatomic nitrogen has a long lifetime, allowing the nitriding to be efficiently executed. The elimination of organic matters that have been generated through the dissociating reaction of triallylamine and adhered to the wafer is also promoted.

After completing this nitriding process, the atmosphere is replaced by an inert gas such as nitrogen gas ($N_2$) or argon gas (Ar), and thereby the wafer is lowered in temperature (corresponding to V4 in FIG. 13) in an oxygen and moisture extremely reduced atmosphere. The insulating film formation is completed through the above processes.

According to the present embodiment, an insulating film having the nitrided film 22 can be formed between the oxide film 23 and the silicon substrate 21. In the present embodiment, only a small quantity of hydrogen exists in the nitrided film 22 differently from the nitriding by ammonia, and therefore, a small quantity of electron traps and surface states result. Further, when oxy-nitriding the film with a compound gas atmosphere of nitrogen and oxygen such as $N_2O$, the oxidation and nitriding simultaneously progress. Therefore, the film thickness and the nitrogen density in the film are hard to be independently controlled, and the nitrogen density is also hard to be increased. In contrast to the above, according to the present insulating film forming method, the oxidation and nitriding can be independently executed. Therefore, the film thickness and the nitrogen density can be independently controlled, and the nitrogen density can be increased.

(Fourth Embodiment)

Figure 6A:
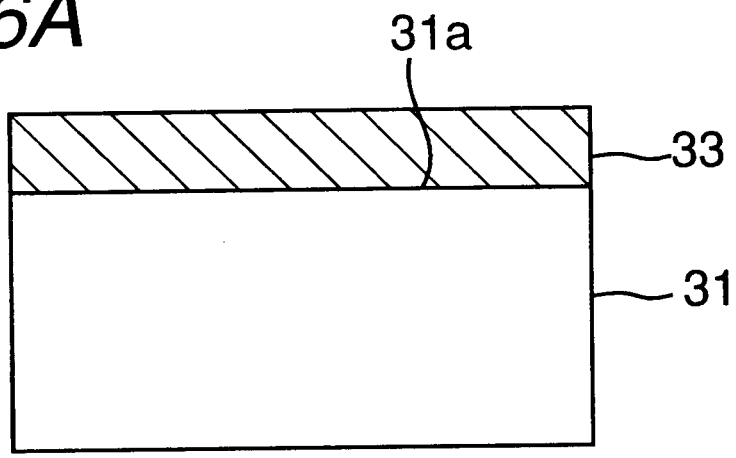
FIG. 6 is a view showing a forming process according to a fourth embodiment of the insulating film forming method of the present invention.
Figure 6B:
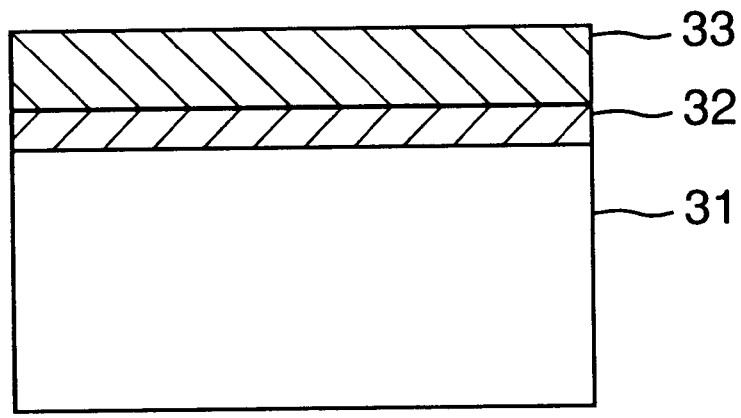
Figure 14:
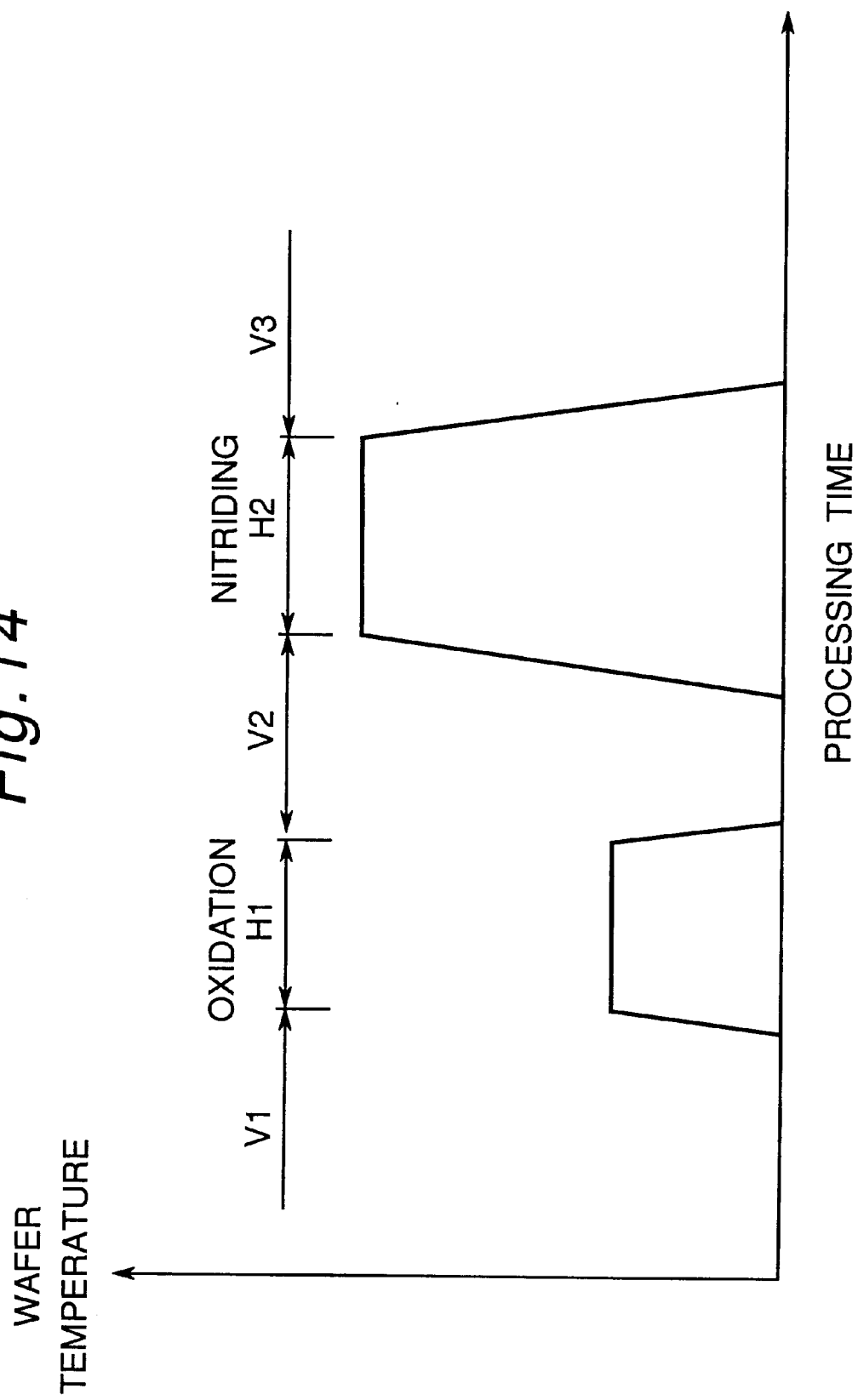
FIG. 14 is an explanatory graph of a heating cycle of the fourth embodiment of the insulating film forming method of the present invention.
Figure 15:
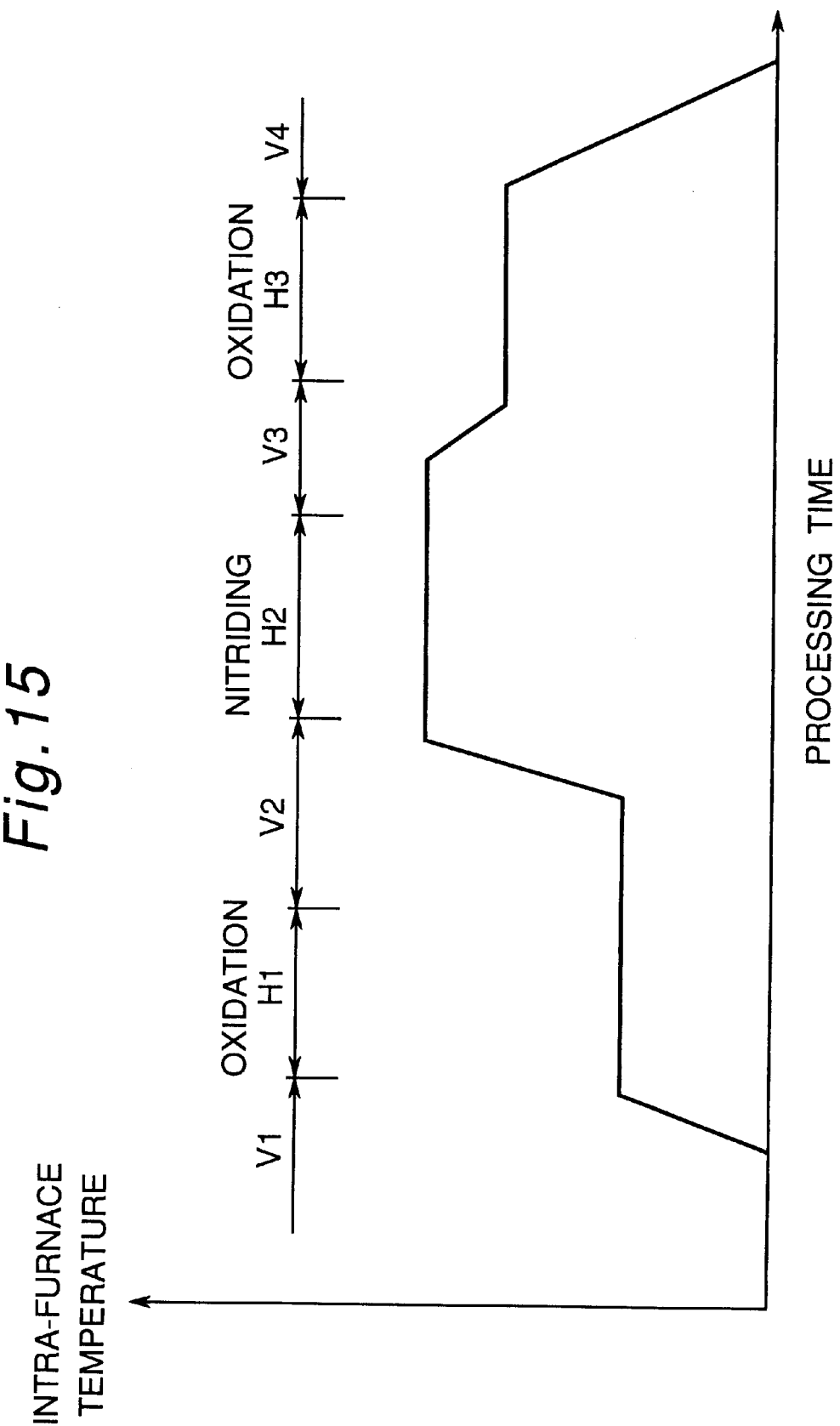
FIG. 15 is an explanatory graph of a heating cycle of the fifth embodiment of the insulating film forming method of the present invention.

A fourth embodiment of the insulating film forming method of the present invention will be described. FIGS. 6A and 6B and FIG. 14 show a process chart and an explanatory graph of a heating cycle for explaining the insulating film forming method of the present embodiment. In the explanatory graph of FIG. 14, the heating cycle is shown with a wafer temperature measured by an optical pyrometer or the like plotted along the axis of ordinates and a processing time plotted along the axis of abscissas. In the present embodiment, a lamp heating system apparatus is used as an insulating film forming apparatus. It is to be noted that the nitrided film described in the present embodiment is defined as a film (SiON) which is formed through the reaction of nitride species in the vicinity of the interface between the silicon substrate and the oxide film and includes a great quantity of nitrogen and oxygen.

By cleaning a silicon substrate 31 in the cleaning room 114 (See FIG. 19), its surface is made clean and free of any natural oxide film. Subsequently, by replacing the atmosphere in the cleaning room with an inert gas such as nitrogen gas ($N_2$) or argon gas (Ar) or forming a high vacuum of $10^{-4}$ to $10^{-6}$ Pa, the silicon substrate 31 is transferred in an oxygen and moisture extremely reduced atmosphere and then placed in an oxidation and nitriding use reaction tube of the chamber 115 kept in the oxygen and moisture extremely reduced atmosphere, wherein the reduction of oxygen and moisture is previously performed by replacing the atmosphere with an inert gas such as nitrogen gas ($N_2$) or argon gas (Ar) or forming a high vacuum of $10^{-4}$ to $10^{-6}$ Pa.

Next, the substrate is raised in temperature (corresponding to V1 in FIG. 14) in the above atmosphere.

Through this process, the formation of a natural oxide film having a degraded film quality due to the oxidation in the temperature raising stage is suppressed and a silicon surface which is clean and free of any natural oxide film can be maintained. Since the lamp heating system apparatus can raise or lower temperature in a short time, the natural oxide film formation is further reduced. Subsequently, the wafer having the silicon surface being clean and free of any natural oxide film is introduced into the oxidation and nitriding use reaction tube and is oxidized at a temperature of 700 to 1000° C. (corresponding to H1 in FIG. 14), thereby forming an oxide film 33 as shown in FIG. 6A. Particularly, by executing this process at a low pressure of not greater than 1 Pa, the wafer can be lamellarly oxidized one atomic layer by one atomic layer. Further, by providing the oxidative gas by moisture vapor ($H_2O$), ozone ($O_3$) or these gases mixed with oxygen gas ($H_2O/O_2$, $O_3/O_2$), the oxygen atom generated through the dissociation of $O_3$, or $H_2O$ molecule itself is used as the oxide species having a smaller particle diameter than the $O_2$ molecule. By virtue of these oxide species, the oxide film 33 obtained through the present oxidation process becomes dense and has an interfacial flatness as compared with the case where the film is formed by only oxygen molecules. Since the oxidizing rate is great in these atmospheres, it is better to execute the oxidation at a low pressure of not greater than 1 Pa for the lamellar oxidation. The oxide film 33 formed through the oxidation described as above has a small variation in film thickness and a smooth interface. With this arrangement, variations in film thickness and nitrogen density in the nitriding process as described later can be reduced. It is to be noted that the desired total insulating film thickness is mainly obtained by adjusting the pressure and time in this oxide film forming stage.

Subsequent to this oxidation process, the atmosphere is replaced by an inert gas such as nitrogen gas ($N_2$) or argon gas (Ar), and the wafer is lowered in temperature by air-cooling and then raised in temperature (corresponding to V2 in FIG. 14) in an oxygen and moisture extremely reduced atmosphere. Through this process, even a slight oxidation is suppressed, and therefore, not only the subsequent variations in film thickness and nitrogen density can be reduced but also the inclusion of hydrogen atoms in the present insulating film are suppressed. Therefore, the possible occurrence of the deterioration of the device such as a surface state and an electron trap attributed to the hydrogen is also suppressed. Since the lamp heating system apparatus can raise or lower temperature in a short time, the inclusions of oxygen and hydrogen are further reduced. Subsequently, triallylamine or this mixed with an inert gas of nitrogen, argon or the like is introduced into the reaction tube at a temperature of 700 to 1150° C. (corresponding to H2 in FIG. 14). Through this process, a monoatomic nitrogen is generated by the thermal dissociation, so that a nitrided film 32 (having a film thickness of 0.5 to 3 nm) is formed in the vicinity of an interface 31a between the oxide film 33 and the silicon substrate 31 as shown in FIG. 6B. The film thickness of the nitrided film 32 is adjusted so that a stress at the interface between the insulating film and the silicon substrate 31 is suitable, and the increase of hole traps and the reduction in carrier mobility are suppressed. Since the lamp heating system apparatus can achieve a heat treatment in a short time, the film thickness and the nitrogen density of the nitrided film 32 are easy to be controlled. Since the variation in the film thickness of the oxide film 33 is small and an interface 31a between the oxide film 33 and the silicon substrate 31 is smooth, the variations in the thickness and the nitrogen density of the nitrided film 32 formed through this nitriding process are reduced. In the case where only triallylamine is vaporized and introduced, the process is executed at a low pressure of not greater than 100 Pa. In this case, because of the low pressure, the dissociation of triallylamine is promoted and the monoatomic nitrogen has a long lifetime, allowing the nitriding to be efficiently executed. The elimination of organic matters that have been generated through the dissociating reaction of triallylamine and adhered to the wafer is also promoted.

After completing this nitriding process, the atmosphere is replaced by an inert gas such as nitrogen gas ($N_2$) or argon gas (Ar), and thereby the wafer is lowered in temperature (corresponding to V3 in FIG. 14) in an oxygen and moisture extremely reduced atmosphere. The insulating film formation is completed through the above processes.

According to the present embodiment, an insulating film having the nitrided film 32 can be formed between the oxide film 33 and the silicon substrate 31. In the present embodiment, only a small quantity of hydrogen exists in the nitrided film 32 differently from the nitriding by ammonia, and therefore, a small quantity of electron traps and surface states result. Further, when oxy-nitriding the film with a compound gas atmosphere of nitrogen and oxygen such as $N_2O$, the oxidation and nitriding simultaneously progress. Therefore, the film thickness and the nitrogen density in the film are hard to be independently controlled, and the nitrogen density is also hard to be increased. In contrast to the above, according to the present insulating film forming method, the oxidation and nitriding can be independently executed. Therefore, the film thickness and the nitrogen density can be independently controlled, and the nitrogen density can be increased.

(Fifth Embodiment)

A fifth embodiment of the insulating film forming method of the present invention will be described. FIGS. 7A through 7C and FIG. 15 show a process chart and an explanatory graph of a heating cycle for explaining the insulating film forming method of the present embodiment. In the explanatory graph of FIG. 15, the heating cycle is shown with an intra-furnace temperature plotted along the axis of ordinates and a processing time plotted along the axis of abscissas. In the present embodiment, a resistance heating type furnace is used as an insulating film forming apparatus. It is to be noted that the nitrided film described in the present embodiment is defined as a film (SiON) which is formed through the reaction of nitride species in the vicinity of the interface between the silicon substrate and the oxide film and includes a great quantity of nitrogen and oxygen.

By cleaning a silicon substrate 41 in the cleaning room 114 (See FIG. 19), its surface is made clean and free of any natural oxide film. Subsequently, by replacing the atmosphere in the cleaning room with an inert gas such as nitrogen gas ($N_2$) or argon gas (Ar) or forming a high vacuum of $10^{-4}$ to $10^{-6}$ Pa, the silicon substrate 41 is transferred in an oxygen and moisture extremely reduced atmosphere and then placed in an oxidation and nitriding use reaction tube of the chamber 115 kept in the oxygen and moisture extremely reduced atmosphere, wherein the reduction of oxygen and moisture is previously performed by replacing the atmosphere with an inert gas such as nitrogen gas ($N_2$) or argon gas (Ar) or forming a high vacuum of $10^{-4}$ to $10^{-6}$ Pa.

Figure 7A:
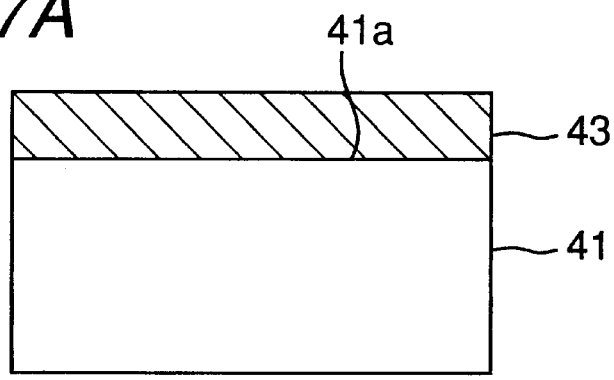
FIG. 7 is a view showing a forming process according to a fifth embodiment of the insulating film forming method of the present invention.

Next, the substrate is raised in temperature (corresponding to V1 in FIG. 15) in the above atmosphere. Through this process, the formation of a natural oxide film having a degraded film quality due to the oxidation in the temperature raising stage is suppressed and a silicon surface which is clean and free of any natural oxide film can be maintained. Subsequently, the wafer which has the silicon surface being clean and free of any natural oxide film is introduced into the reaction tube and is oxidized by an oxidative gas at a temperature of 600 to 900° C. (corresponding to H1 in FIG. 15), thereby forming an oxide film 43 as shown in FIG. 7A. Particularly, by executing this process at a low pressure of not greater than 1 Pa, the wafer can be lamellarly oxidized one atom layer by one atomic layer. Further, by providing the oxidative gas by moisture vapor ($H_2O$), ozone ($O_3$) or these gases mixed with oxygen gas ($H_2O/O_2$, $O_3/O_2$), the oxygen atom generated from the $O_3$ molecule or $H_2O$ molecule is used as the oxide species having a smaller particle diameter than the $O_2$ molecule. By virtue of these oxide species, the oxide film 43 obtained through the present oxidation process becomes dense and has an interfacial flatness as compared with the case where the film is formed by only oxygen molecules. Since the oxidizing rate is great in these atmospheres, it is better to execute the oxidation at a low pressure of not greater than 1 Pa for the lamellar oxidation. The oxide film 43 formed through the oxidation described as above has a small variation in film thickness and a smooth interface. With this arrangement, variations in film thickness and nitrogen density in the nitriding process as described later can be reduced. It is to be noted that the desired total insulating film thickness is mainly obtained by adjusting the pressure and time in this oxide film forming stage.

Figure 7B:
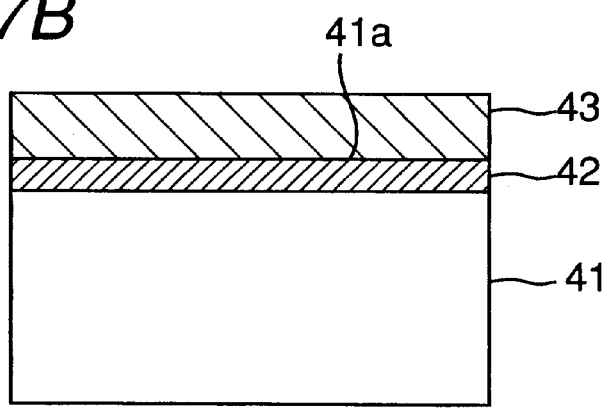

Subsequent to this oxidation process, the atmosphere is replaced by an inert gas such as nitrogen gas ($N_2$) or argon gas (Ar), and the wafer is raised in temperature (corresponding to V2 in FIG. 15) in an oxygen and moisture extremely reduced atmosphere. Through this process, even a slight oxidation is suppressed, and therefore, not only the subsequent variations in film thickness and nitrogen density can be reduced but also the inclusion of hydrogen atoms in the present insulating film are suppressed. Therefore, the possible occurrence of the deterioration of the device such as a surface state and an electron trap attributed to the hydrogen is also suppressed. Subsequently, triallylamine or this mixed with an inert gas of nitrogen, argon or the like is introduced into the reaction tube at a temperature of 700 to 1000° C. (corresponding to H2 in FIG. 15). Through this process, a monoatomic nitrogen is generated by the thermal dissociation, so that a nitrided film 42 (having a film thickness of 0.5 to 3 nm) is formed in the vicinity of an interface 41a between the oxide film 43 and the silicon substrate 41 as shown in FIG. 7B. The film thickness of the nitrided film 42 is adjusted so that a stress at the interface between the insulating film and the silicon substrate 41 is suitable, and the increase of hole traps and the reduction in carrier mobility are suppressed. The variation in oxide film thickness is small and the interface is smooth prior to the nitriding process, and therefore, the nitrided film 42 has small variations in film thickness and nitrogen density. In the case where only triallylamine is vaporized and introduced, the process is executed at a low pressure of not greater than 100 Pa. In this case, because of the low pressure, the dissociation of triallylamine is promoted and the monoatomic nitrogen has a long lifetime, allowing the nitriding to be efficiently executed. The elimination of organic matters that have been generated through the dissociating reaction of triallylamine and adhered to the wafer is also promoted.

Figure 7C:
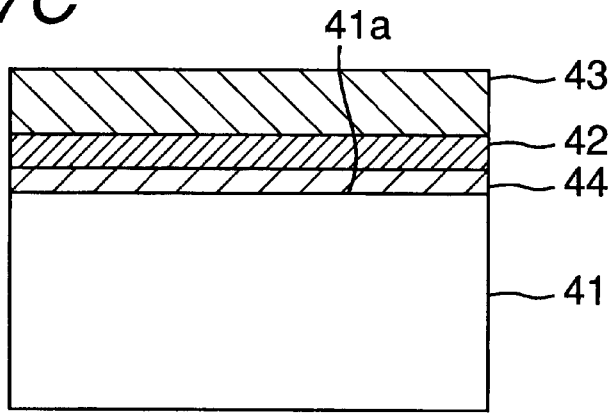

After completing this nitriding, the atmosphere is replaced by an inert gas such as nitrogen gas ($N_2$) or argon gas (Ar), and thereby the substrate is lowered in temperature (corresponding to V3 in FIG. 15) in an oxygen and moisture extremely reduced atmosphere and then re-oxidized at a temperature of 700 to 950° C. (corresponding to H3 in FIG. 15). Through this process, an oxidized film 44 (having a film thickness of 1 to 5 nm) is formed as shown in FIG. 7C. In this case, the oxidized film herein is defined as a film (SiON) which is formed through the reaction of oxide species in the vicinity of the interface between the silicon substrate and the nitride film and includes a great quantity of nitrogen as well as an abundance of oxygen ingredients.

In an attempt to prevent the diffusion of the oxide species from being influenced by the nitrogen atoms in a nitrided film 42, this re-oxidizing process must use moisture vapor ($H_2O$) or atomic oxygen (O) having a great diffusion coefficient. However, according to the re-oxidizing process with moisture vapor, a great quantity of electron traps are formed at the interface on the substrate side, which is disadvantageous in terms of the long-term reliability of the device. Since the atomic oxygen can be generated by dissociating ozone ($O_3$), it is preferable to execute the re-oxidizing process in an atmosphere of ozone ($O_3$) or this mixed with oxygen gas ($O_3/O_2$). The oxidizing rate is great in these atmospheres, however, the thin oxidized film 44 is formed at a low pressure of not greater than 1 Pa in order to improve the film thickness controllability by reducing the oxidizing rate without reducing the diffusion coefficient of the oxide species. Through the present oxidation, a small quantity of dangling bonds of nitrogen atoms in the nitrided film 42 results, so that electron traps and Poole-Frenkel current can be reduced. Furthermore, an interface 41a between the insulating film and the silicon substrate 41 is made to have a structure similar to that of the $Si/SiO_2$ interface, so that the surface states can be reduced and the problems attended by the nitriding process such as the increase of hole traps attributed to the change in strain on the interface 41a and the chemical species concerned with nitrogen such as $Si_2$=NH, or the reduction in carrier mobility in the region where an electric field is low in a direction perpendicular to the MOS interface can be solved. The thickness of the oxidized film 44 is appropriate for causing this effect. Furthermore, the organic matter that has been generated by the dissociation of triallylamine in the preceding nitriding process and adhered to the wafer surface can be removed by this oxidation. This arrangement can prevent the inclusions of any organic matter in the vicinity of the interface between the gate electrode and the gate insulating film during forming the gate electrode by CVD or the like after the formation of the gate insulating film.

After this re-oxidizing process, the atmosphere is replaced by an inert gas such as nitrogen gas ($N_2$) or argon gas (Ar), and thereby the substrate is lowered in temperature (corresponding to V4 in FIG. 15) in an oxygen and moisture extremely reduced atmosphere. The insulating film formation is completed through the above processes.

According to the present embodiment, an insulating film having the nitrided film 42 can be formed between the oxide films 43 and 44. In the present embodiment, only a small quantity of hydrogen exists in the nitrided film 42 differently from the nitriding by ammonia, and therefore, a small quantity of electron traps and surface states result. Further, when oxy-nitriding the film with a compound gas atmosphere of nitrogen and oxygen such as $N_2O$, the oxidation and nitriding simultaneously progress. Therefore, the film thickness and the nitrogen density in the film are hard to be independently controlled, and the nitrogen density is also hard to be increased. In contrast to the above, according to the present insulating film forming method, the oxidation and nitriding can be independently executed. Therefore, the film thickness and the nitrogen density can be independently controlled, and the nitrogen density can be increased. Furthermore, according to the present structure, the oxidized film 44 exists between the nitrided film 42 and the silicon substrate 41. Therefore, the interface 41a between the insulating film and the silicon substrate 41 is made to have a structure similar to that of the $Si/SiO_2$ interface, so that the surface states can be reduced and the problems attended by the nitriding process such as the increase of hole traps attributed to the change in strain on the $Si/SiO_2$ interface and the chemical species concerned with nitrogen such as $Si_2$=NH, or the reduction in carrier mobility in the region where an electric field is low in a direction perpendicular to the MOS interface can be solved. Furthermore, there are small variations in film thickness and nitrogen density, and therefore, a satisfactory dielectric breakdown characteristic can be obtained.

(Sixth Embodiment)

Figure 8A:
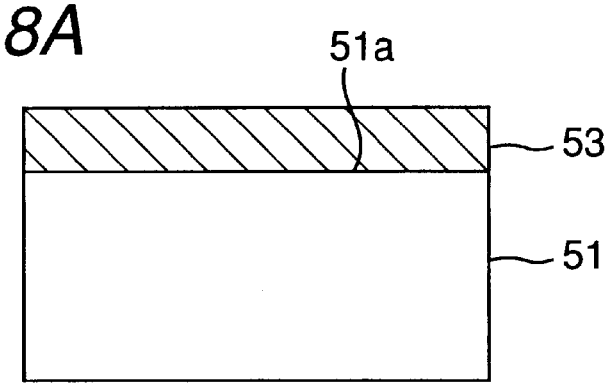
FIG. 8 is a view showing a forming process according to a sixth embodiment of the insulating film forming method of the present invention.
Figure 8B:
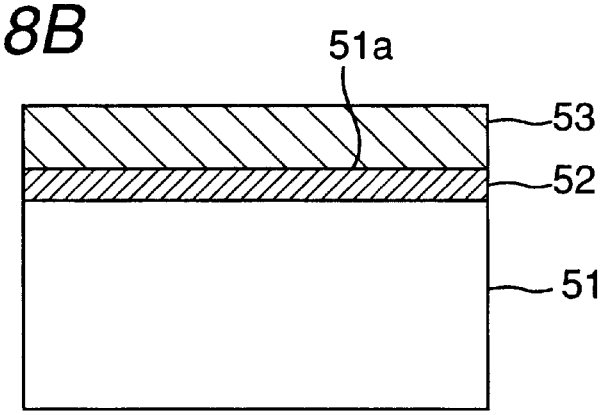
Figure 16:
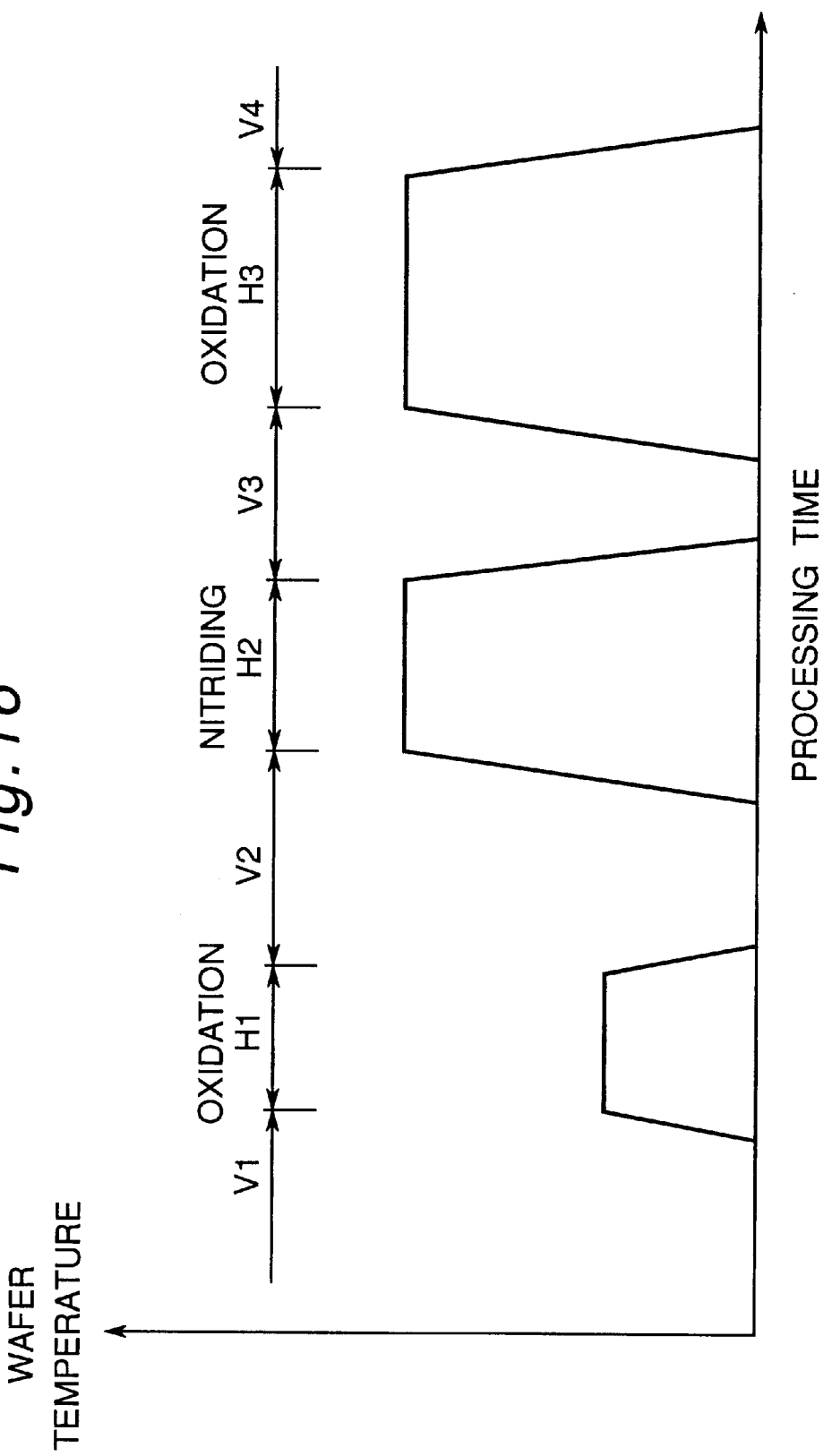
FIG. 16 is an explanatory graph of a heating cycle of the sixth embodiment of the insulating film forming method of the present invention.
Figure 17:
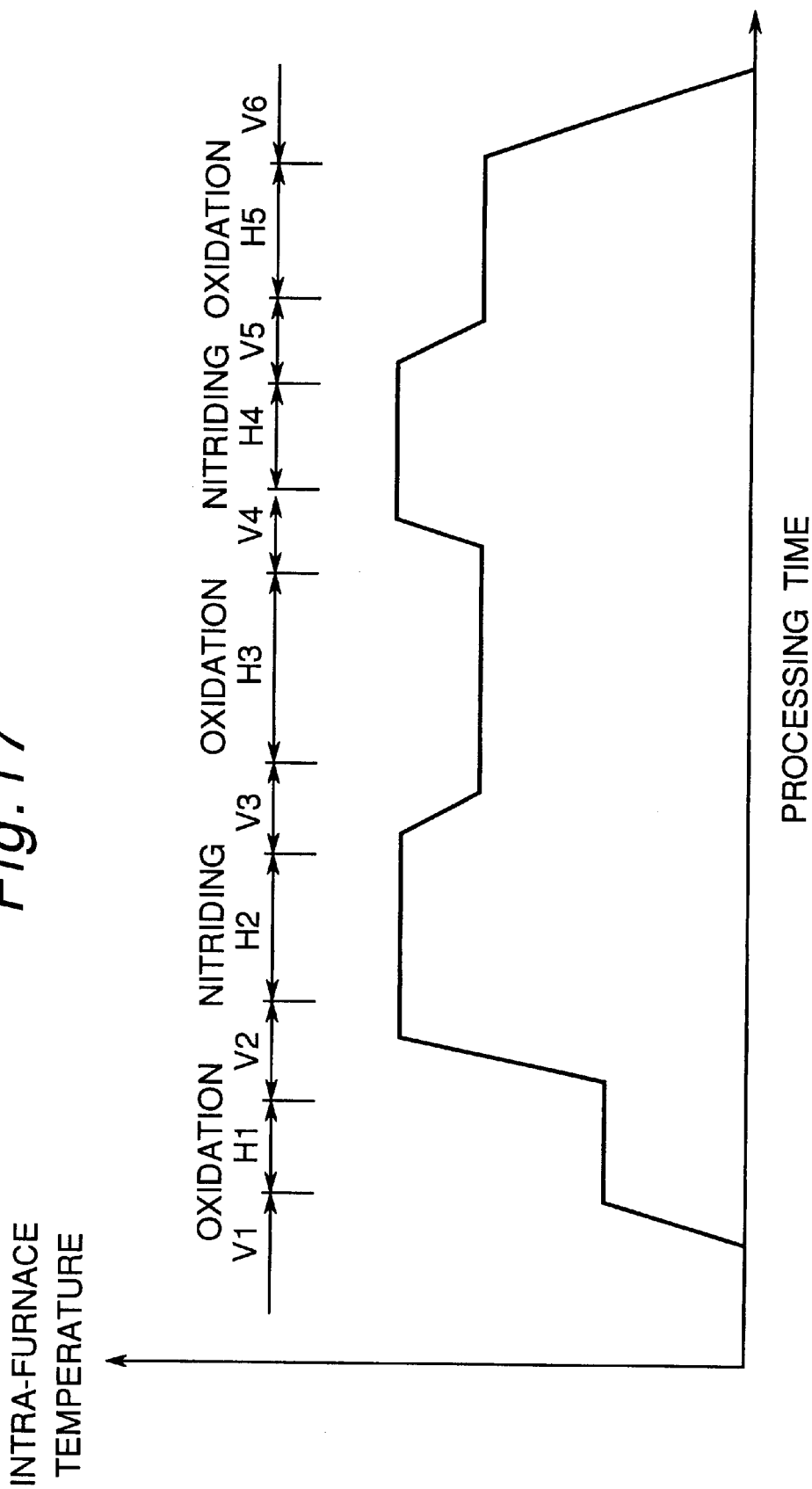
FIG. 17 is an explanatory graph of a heating cycle of the seventh embodiment of the insulating film forming method of the present invention.

A sixth embodiment of the insulating film forming method of the present invention will be described. FIGS. 8A trough 8C and FIG. 16 show a process chart and an explanatory graph of a heating cycle for explaining the insulating film forming method of the present embodiment. In the explanatory graph of FIG. 16, the heating cycle is shown with a wafer temperature measured by an optical pyrometer or the like plotted along the axis of ordinates and a processing time plotted along the axis of abscissas. In the present embodiment, a lamp heating system apparatus is used as an insulating film forming apparatus. It is to be noted that the nitrided film described in the present embodiment is defined as a film (SiON) which is formed through the reaction of nitride species in the vicinity of the interface between the silicon substrate and the oxide film and includes a great quantity of nitrogen and oxygen.

By cleaning a silicon substrate 51 in the cleaning room 114 (See FIG. 19), its surface is made clean and free of any natural oxide film. Subsequently, by replacing the atmosphere in the cleaning room with an inert gas such as nitrogen gas ($N_2$) or argon gas (Ar) or forming a high vacuum of $10^{-4}$ to $10^{-6}$ Pa, the silicon substrate 51 is transferred in an oxygen and moisture extremely reduced atmosphere and then placed in an oxidation and nitriding use reaction tube of the chamber 115 kept in the oxygen and moisture extremely reduced atmosphere, wherein the reduction of oxygen and moisture is previously performed by replacing the atmosphere with an inert gas such as nitrogen gas ($N_2$) or argon gas (Ar) or forming a high vacuum of $10^{-4}$ to $10^{-6}$ Pa. Next, the substrate is raised in temperature (corresponding to V1 in FIG. 16) in the above atmosphere. Through this process, the formation of a natural oxide film having a degraded film quality due to the oxidation in the temperature raising stage is suppressed and a silicon surface which is clean and free of any natural oxide film can be maintained. Since the lamp heating system apparatus can raise or lower temperature in a short time, the natural oxide film formation is further reduced. Subsequently, the wafer having the silicon surface being clean and free of any natural oxide film is introduced into the oxidation and nitriding use reaction tube and is oxidized at a temperature of 700 to 1000° C. (corresponding to H1 in FIG. 16), thereby forming an oxide film 53 as shown in FIG. 8A. Particularly, by executing this process at a low pressure of not greater than 1 Pa, the wafer can be lamellarly oxidized one atomic layer by one atomic layer. Further, by providing the oxidative gas by moisture vapor ($H_2O$), ozone ($O_3$) or these gases mixed with oxygen gas ($H_2O/O_2$, $O_3/O_2$), the oxygen atom generated from the $O_3$ molecule or $H_2O$ molecule itself is used as the oxide species having a smaller particle diameter than the $O_2$ molecule. By virtue of these oxygen species, the oxide film 53 obtained through the present oxidation process becomes dense and has an interfacial flatness as compared with the case where the film is formed by only oxygen molecules. Since the oxidizing rate is great in these atmospheres, it is better to execute the oxidation at a low pressure of not greater than 1 Pa for the lamellar oxidation. The oxide film 53 formed through the oxidation described as above has a small variation in film thickness and a smooth interface. With this arrangement, variations in film thickness and nitrogen density in the nitriding process as described later can be reduced. It is to be noted that the desired total insulating film thickness is mainly obtained by adjusting the pressure and time in this oxide film forming stage.

Subsequent to this oxidation process, the atmosphere is replaced by an inert gas such as nitrogen gas ($N_2$) or argon gas (Ar), and the wafer is lowered in temperature by air-cooling and then raised in temperature (corresponding to V2 in FIG. 16) in an oxygen and moisture extremely reduced atmosphere. Through this process, even a slight oxidation is suppressed, and therefore, not only the subsequent variations in film thickness and nitrogen density can be reduced but also the inclusion of hydrogen atoms in the present insulating film are suppressed. Therefore, the possible occurrence of the deterioration of the device such as a surface state and an electron trap attributed to the hydrogen is also suppressed. Since the lamp heating system apparatus can raise or lower temperature in a short time, the inclusions of oxygen and hydrogen are further reduced. Subsequently, triallylamine or this mixed with an inert gas of nitrogen, argon or the like is introduced into the reaction tube at a temperature of 700 to 1150° C. (corresponding to H2 in FIG. 16). Through this process, a monoatomic nitrogen is generated by the thermal dissociation, so that a nitrided film 52 (having a film thickness of 0.5 to 3 nm) is formed in the vicinity of an interface 51a between the oxide film 53 and the silicon substrate 51. The thickness of the nitrided film 52 is adjusted so that a stress at the interface between the insulating film and the silicon substrate 51 is suitable, and the increase of hole traps and the reduction in carrier mobility are suppressed. Since the lamp heating system apparatus can achieve a heat treatment in a short time, the film thickness and the nitrogen density of the nitrided film 52 are easy to be controlled. Since the variation in the film thickness of the oxide film 53 is small and an interface 51a between the oxide film 53 and the silicon substrate 51 is smooth, the variations in the thickness and the nitrogen density of the nitrided film 52 formed through this nitriding process are reduced. In the case where only triallylamine is vaporized and introduced, the process is executed at a low pressure of not greater than 100 Pa. In this case, because of the low pressure, the dissociation of triallylamine is promoted and the monoatomic nitrogen has a long lifetime, allowing the nitriding to be efficiently executed. The elimination of organic matters that have been generated through the dissociating reaction of triallylamine and adhered to the wafer is also promoted.

Figure 8C:
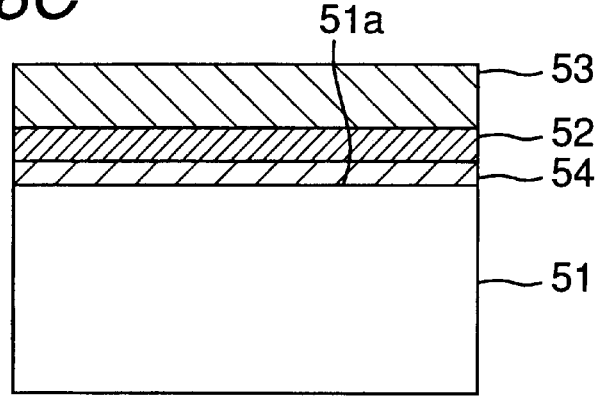

After completing this nitriding process, the atmosphere is replaced by an inert gas such as nitrogen gas ($N_2$) or argon gas (Ar), and thereby the substrate is lowered in temperature by air-cooling and thereafter raised again in temperature by lamp heating (corresponding to V3 in FIG. 16) in an oxygen and moisture extremely reduced atmosphere and then re-oxidized at a temperature of 700 to 1000° C. (corresponding to H3 in FIG. 16). Through this process, an oxidized film 54 (having a film thickness of 1 to 5 nm) is formed as shown in FIG. 8C. In this case, the oxidized film 54 herein is defined as a film similar to the oxidized film of the fifth embodiment. In an attempt to prevent the diffusion of the oxide species from being influenced by the nitrogen atoms in a nitrided film 52, this re-oxidizing process must use moisture vapor ($H_2O$) or atomic oxygen (O) having a great diffusion coefficient. However, according to the re-oxidizing process with moisture vapor, a great quantity of electron traps are formed at the interface on the substrate side, which is disadvantageous in terms of the long-term reliability of the device. Since the atomic oxygen can be generated by dissociating ozone ($O_3$), it is preferable to execute the re-oxidizing process in an atmosphere of ozone ($O_3$) or this mixed with oxygen gas ($O_3/O_2$). The oxidizing rate is great in these atmospheres, however, the thin oxidized film 54 is formed at a low pressure of not greater than 1 Pa in order to improve the film thickness controllability by reducing the oxidizing rate without reducing the diffusion coefficient of the oxide species. Through the present oxidation, a small quantity of dangling bonds of nitrogen atoms in the nitrided film 52 results, so that electron traps and Poole-Frenkel current can be reduced. Furthermore, an interface 51a between the insulating film and the silicon substrate 51 is made to have a structure similar to that of the $Si/SiO_2$ interface, so that the surface states can be reduced and the problems attended by the nitriding process such as the increase of hole traps attributed to the change in strain on the interface 51a and the chemical species concerned with nitrogen such as $Si_2$=NH, or the reduction in carrier mobility in the region where an electric field is low in a direction perpendicular to the MOS interface can be solved. The thickness of the oxidized film 54 is appropriate for causing this effect. Furthermore, the organic matter that has been generated by the dissociation of triallylamine in the preceding nitriding process and adhered to the wafer surface can be removed by this oxidation. This arrangement can prevent the inclusions of any organic matter in the vicinity of the interface between the gate electrode and the gate insulating film during forming the gate electrode by CVD or the like after the formation of the gate insulating film.

After this re-oxidizing process, the atmosphere is replaced by an inert gas such as nitrogen gas ($N_2$) or argon gas (Ar), and thereby the substrate is lowered in temperature (corresponding to H3 in FIG. 16) in an oxygen and moisture extremely reduced atmosphere. The insulating film formation is completed through the above processes.

According to the present embodiment, an insulating film having the nitrided film 52 can be formed between the oxide films 53 and 54. In the present embodiment, only a small quantity of hydrogen exists in the nitrided film 52 differently from the nitriding by ammonia, and therefore, a small quantity of electron traps and surface states result. Further, when oxy-nitriding the film with a compound gas atmosphere of nitrogen and oxygen such as $N_2O$, the oxidation and nitriding simultaneously progress. Therefore, the film thickness and the nitrogen density in the film are hard to be independently controlled, and the nitrogen density is also hard to be increased. In contrast to the above, according to the present insulating film forming method, the oxidation and nitriding can be independently executed. Therefore, the film thickness and the nitrogen density can be independently controlled, and the nitrogen density can be increased.

Furthermore, according to the present structure, the oxidized film 54 exists between the nitrided film 52 and the silicon substrate 51. Therefore, the interface 51a between the insulating film and the silicon substrate 51 is made to have a structure similar to that of the $Si/SiO_2$ interface, so that the surface states can be reduced and the problems attended by the nitriding process such as the increase of hole traps attributed to the change in strain on the $Si/SiO_2$ interface and the chemical species concerned with nitrogen such as $Si_2$=NH, or the reduction in carrier mobility in the region where an electric field is low in a direction perpendicular to the MOS interface can be solved. Furthermore, there are small variations in film thickness and nitrogen density, and therefore, a satisfactory dielectric breakdown characteristic can be obtained.

(Seventh Embodiment)

A seventh embodiment of the insulating film forming method of the present invention will be described. FIGS. 9A through 9E and FIG. 17 show a process chart and an explanatory graph of a heating cycle for explaining the insulating film forming method of the present embodiment. In the explanatory graph of FIG. 17, the heating cycle is shown with an intra-furnace temperature plotted along the axis of ordinates and a processing time plotted along the axis of abscissas. In the present embodiment, a resistance heating type furnace is used. It is to be noted that the nitrided film described in the present embodiment is defined as a film (SiON) which is formed through the reaction of nitride species in the vicinity of the interface between the silicon substrate and the oxide film and includes a great quantity of nitrogen and oxygen.

By cleaning a silicon substrate 61 in the cleaning room 114 (See FIG. 19), its surface is made clean and free of any natural oxide film. Subsequently, by replacing the atmosphere in the cleaning room with an inert gas such as nitrogen gas ($N_2$) or argon gas (Ar) or forming a high vacuum of $10^{-4}$ to $10^{-6}$ Pa, the silicon substrate 61 is transferred in an oxygen and moisture extremely reduced atmosphere and then placed in an oxidation and nitriding use reaction tube of the chamber 115 kept in the oxygen and moisture extremely reduced atmosphere, wherein the reduction of oxygen and moisture is previously performed by replacing the atmosphere with an inert gas such as nitrogen gas ($N_2$) or argon gas (Ar) or forming a high vacuum of $10^{-4}$ to $10^{-6}$ Pa.

Figure 9A:
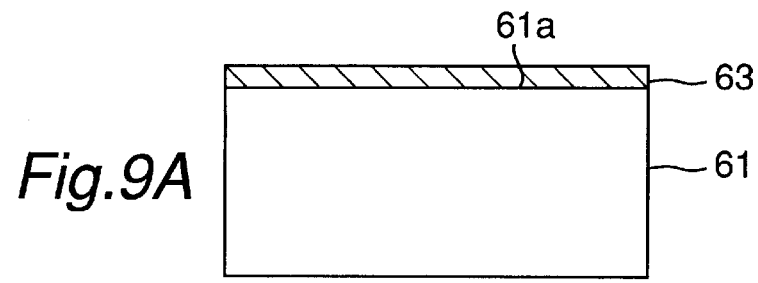
FIG. 9 is a view showing a forming process according to a seventh embodiment of the insulating film forming method of the present invention.

Next, the substrate is raised in temperature (corresponding to V1 in FIG. 17) in the above atmosphere. Through this process, the formation of a natural oxide film having a degraded film quality due to the oxidation in the temperature raising stage is suppressed and a silicon surface which is clean and free of any natural oxide film can be maintained. Since the intra-furnace temperature is not higher than 700° C., the surface of the silicon substrate 61 is not nitrided even in the nitrogen gas atmosphere. Subsequently, the wafer having the silicon surface which is clean and free of any natural oxide film is introduced into the oxidation and nitriding use reaction tube and is slowly oxidized at a temperature of 300 to 700° C. (H1 in FIG. 17), thereby forming an oxide film 63 (having a film thickness of 0.3 to 1 nm) as shown in FIG. 9A. Particularly, by executing this process at a low pressure of not greater than 1 Pa, the wafer can be lamellarly oxidized one atomic layer by one atomic layer. Further, by providing the oxidative gas by moisture vapor ($H_2O$), ozone ($O_3$) or these gases mixed with oxygen gas ($H_2O/O_2$, $O_3/O_2$), the oxygen atom generated from the $O_3$ molecule or $H_2O$ molecule itself is used as the oxide species having a smaller particle diameter than the $O_2$ molecule. By virtue of these oxygen species, the oxide film 63 obtained through the present oxidation process becomes dense and has an interfacial flatness as compared with the case where the film is formed by only oxygen molecules.

Since the oxidizing rate is great in these atmospheres, it is better to execute the oxidation at a low pressure of not greater than 1 Pa for the lamellar oxidation. The oxide film 63 formed through the oxidation described as above has a small variation in film thickness and a smooth interface. With this arrangement, variations in film thickness and nitrogen density in the nitriding process as described later can be reduced.

Figure 9B:
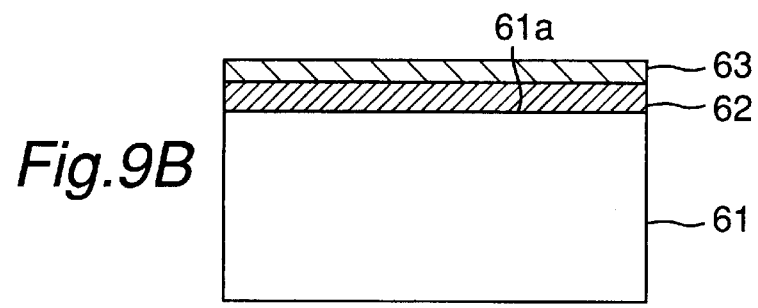

Subsequent to this oxidation process, the atmosphere is replaced by an inert gas such as nitrogen gas ($N_2$) or argon gas (Ar), and the wafer is raised in temperature (corresponding to V2 in FIG. 17) in an oxygen and moisture extremely reduced atmosphere. Subsequently, triallylamine or this mixed with an inert gas of nitrogen, argon or the like is introduced into the reaction tube at a temperature of 700 to 1000° C. (corresponding to H2 in FIG. 17). Through this process, a monoatomic nitrogen is generated by the thermal dissociation, so that a nitrided film 62 (having a film thickness of 0.5 to 3 nm) is formed in the vicinity of an interface 61a between the oxide film 63 and the silicon substrate 61 as shown in FIG. 9B. The variation in oxide film thickness is small and the interface 61a is smooth prior to the nitriding process, and therefore, the nitrided film 62 has small variations in film thickness and nitrogen density. In the case where only triallylamine is vaporized and introduced, the process is executed at a low pressure of not greater than 100 Pa. In this case, because of the low pressure, the dissociation of triallylamine is promoted and the monoatomic nitrogen has a long lifetime, allowing the nitriding to be efficiently executed. The elimination of organic matters that have been generated through the dissociating reaction of triallylamine and adhered to the wafer is also promoted.

Figure 9C:
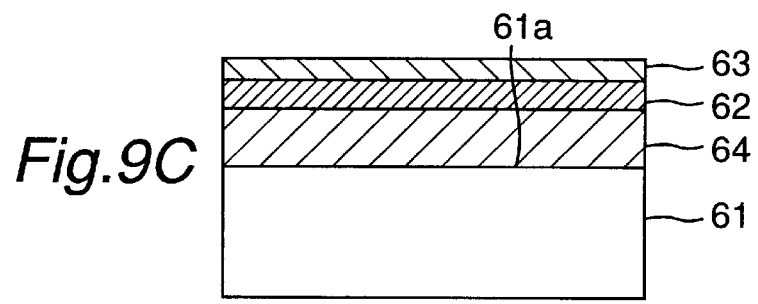

After completing this nitriding, the atmosphere is replaced by an inert gas such as nitrogen gas ($N_2$) or argon gas (Ar), and thereby the substrate is lowered in temperature (corresponding to V3 in FIG. 17) in an oxygen and moisture extremely reduced atmosphere and then oxidized at a temperature of 700 to 950° C. (corresponding to H3 in FIG. 17). Through this process, an oxidized film 64 (having a film thickness of 1 to 5 nm) is formed as shown in FIG. 9C. In this case, the oxidized film 64 herein is the same defined in the fifth embodiment. In an attempt to prevent the diffusion of the oxide species from being influenced by the nitrogen atoms in a nitrided film 62, this oxidizing process must use moisture vapor ($H_2O$) or atomic oxygen (O) having a great diffusion coefficient. However, according to the oxidizing process with moisture vapor, a great quantity of electron traps are formed at the interface on the substrate side, which is disadvantageous in terms of the long-term reliability of the device. Since the atomic oxygen can be generated by dissociating ozone ($O_3$), it is preferable to execute the oxidizing process in an atmosphere of ozone ($O_3$) or this mixed with oxygen gas ($O_3/O_2$). The oxidizing rate is great in these atmospheres, however, the thin oxidized film 64 is formed at a low pressure of not greater than 1 Pa in order to improve the film thickness controllability by reducing the oxidizing rate without reducing the diffusion coefficient of the oxide species. In this case, the oxidation can be executed at a relatively low temperature by virtue of the use of ozone for the oxidation, and therefore, the redistribution of the nitrogen density profile is hard to occur. In order to obtain the desired total insulating film thickness, the pressure and time are mainly adjusted in this oxidation process. Through the present oxidation process, a small quantity of dangling bonds of nitrogen atoms in the nitrided film 62 results, so that electron traps and Poole-Frenkel current can be reduced.

Figure 9D:
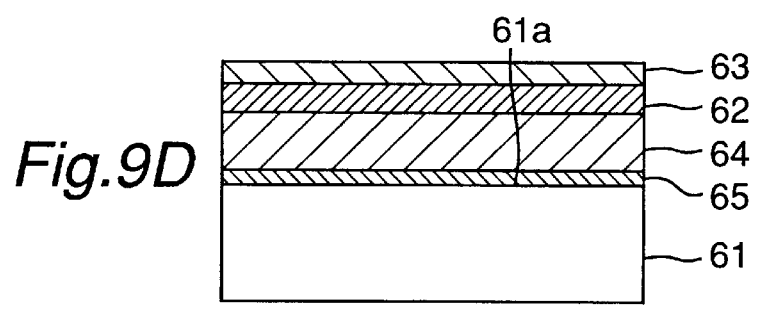

After this re-oxidizing process, the atmosphere is replaced by an inert gas such as nitrogen gas ($N_2$) or argon gas (Ar), and thereby the substrate is raised in temperature (corresponding to V4 in FIG. 17) in an oxygen and moisture extremely reduced atmosphere. Triallylamine or this mixed with inert gas such as nitrogen gas ($N_2$) or argon gas (Ar) is introduced into the oxidation and nitriding use reaction tube at a temperature of 700 to 1000° C. (corresponding to H4 in FIG. 17). Through this process, a monoatomic nitrogen is generated by the thermal dissociation, so that a nitrided film 65 (having a film thickness of 0.5 to 3 nm) is formed in the vicinity of an interface 61a between the oxide film 64 and the silicon substrate 61 as shown in FIG. 9D. The thickness of the nitrided film 65 is adjusted so that a stress at the interface between the insulating film and the silicon substrate 61 is suitable and the increase of hole traps and the reduction in carrier mobility are suppressed. The variation in film thickness of the entire insulating film is small and the interface is smooth prior to the nitriding process, and therefore, the nitrided film 65 formed through this nitriding process has small variations in film thickness and nitrogen density. In the case where only triallylamine is vaporized and introduced, the process is executed at a low pressure of not greater than 100 Pa. In this case, because of the low pressure, the dissociation of triallylamine is promoted and the monoatomic nitrogen has a long lifetime, allowing the nitriding to be efficiently executed. The elimination of organic matters that have been generated through the dissociating reaction of triallylamine and adhered to the wafer is also promoted.

Figure 9E:
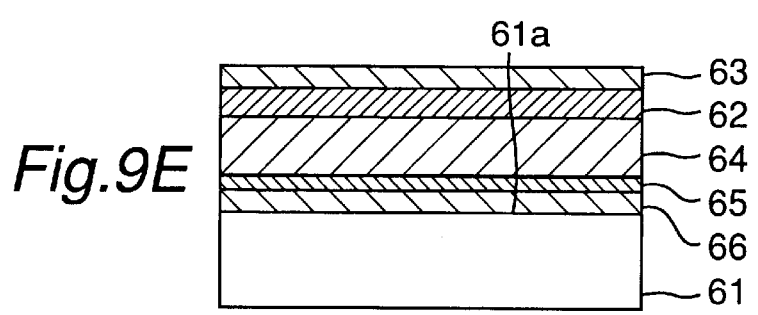

After completing this process, the atmosphere is replaced by an inert gas such as nitrogen gas ($N_2$) or argon gas (Ar), and thereby the substrate is lowered in temperature (corresponding to V5 in FIG. 17) in an oxygen and moisture extremely reduced atmosphere and then re-oxidized at a temperature of 700 to 950° C. (corresponding to H5 in FIG. 17). Through this process, an oxidized film 66 (having a film thickness of 1 to 5 nm) is formed as shown in FIG. 9E. In an attempt to prevent the diffusion of the oxide species from being influenced by the nitrogen atoms in a nitrided films 62 and 65, this re-oxidizing process must use moisture vapor ($H_2O$) or atomic oxygen (O) having a great diffusion coefficient. However, according to the re-oxidizing process with moisture vapor, a great quantity of electron traps are formed at the interface on the substrate side, which is disadvantageous in terms of the long-term reliability of the device. Since the atomic oxygen can be generated by dissociating ozone ($O_3$), it is preferable to execute the re-oxidizing process in an atmosphere of ozone ($O_3$) or this mixed with oxygen gas ($O_3/O_2$). The oxidizing rate is great in these atmospheres, however, the thin oxidized film 66 is formed at a low pressure of not greater than 1 Pa in order to improve the film thickness controllability by reducing the oxidizing rate without reducing the diffusion coefficient of the oxide species. In this case, the oxidation can be executed at a relatively low temperature by virtue of the use of ozone for the oxidation, and therefore, the redistribution of the nitrogen density profile is hard to occur. Through the present oxidation, a small quantity of dangling bonds of nitrogen atoms in the nitrided film 65 results, so that electron traps and Poole-Frenkel current can be reduced. Furthermore, an interface 61a between the insulating film and the silicon substrate 61 is made to have a structure similar to that of the $Si/SiO_2$ interface, so that the surface states can be reduced and the problems attended by the nitriding process such as the increase of hole traps attributed to the change in strain on the interface 41a and the chemical species concerned with nitrogen such as $Si_2$=NH, or the reduction in carrier mobility in the region where an electric field is low in a direction perpendicular to the MOS interface can be solved. The thickness of the oxidized film 66 is appropriate for causing this effect.

After this oxidizing process, the atmosphere is replaced by an inert gas such as nitrogen gas ($N_2$) or argon gas (Ar), and thereby the substrate is lowered in temperature (corresponding to V6 in FIG. 17) in an oxygen and moisture extremely reduced atmosphere. The insulating film formation is completed through the above processes.

According to the present embodiment, insulating films having the nitrided films 62 and 65 can respectively be formed between the oxide films 63, 64 and 66 on the silicon substrate 61. In the present embodiment, only a small quantity of hydrogen exists in the nitrided films 62 and 65 differently from the nitriding by ammonia, and therefore, a small quantity of electron traps and surface states result. Further, when oxy-nitriding the film with a compound gas atmosphere of nitrogen and oxygen such as $N_2O$, the oxidation and nitriding simultaneously progress. Therefore, the film thickness and the nitrogen density in the film are hard to be independently controlled, and the nitrogen density is also hard to be increased. In contrast to the above, according to the present insulating film forming method, the oxidation and nitriding can be independently executed. Therefore, the film thickness and the nitrogen density can be independently controlled, and the nitrogen density can be increased. Furthermore, according to the present insulating film structure, the diffusion of boron and hydrogen from the gate side to the substrate is suppressed by the existence of the nitrided films 62 and 65, and therefore, the extension of the deterioration of the device due to so-called the "penetration of boron" and the hot carrier attributed to the moisture in the interlayer silicon oxide film can be prevented. Particularly in the present insulating film structure, the nitrogen density in the nitrided film 65 is made relatively small as compared with that of the nitrided film 62, and the oxidized film 66 is formed between the nitrided film 65 and the silicon substrate 61. With this arrangement, not only the above problems can be effectively solved but also the problems attended by the nitriding process such as the increase of hole traps attributed to the change in strain on the $Si/SiO_2$ interface and the chemical species concerned with nitrogen such as $Si_2=NH$, or the reduction in carrier mobility in the region where an electric field is low in a direction perpendicular to the MOS interface can be solved. Furthermore, there are small variations in film thickness and nitrogen density by means of the forming method of the present embodiment, and therefore, a satisfactory dielectric breakdown characteristic can be obtained.

(Eighth Embodiment)

An eighth embodiment of the insulating film forming method of the present invention will be described. FIGS. 10A through 10E and FIG. 18 show a process chart and an explanatory graph of a heating cycle for explaining the insulating film forming method of the present embodiment. In the explanatory graph of FIG. 18, the heating cycle is shown with a wafer temperature measured by an optical pyrometer or the like plotted along the axis of ordinates and a processing time plotted along the axis of abscissas. The present embodiment uses a lamp heating system apparatus. It is to be noted that the nitrided film described in the present embodiment is defined as a film (SiON) which is formed through the reaction of nitride species in the vicinity of the interface between the silicon substrate and the oxide film and includes a great quantity of nitrogen and oxygen.

By cleaning a silicon substrate 71 in the cleaning room 114 (See FIG. 19), its surface is made clean and free of any natural oxide film. Subsequently, by replacing the atmosphere in the cleaning room with an inert gas such as nitrogen gas or argon gas or forming a high vacuum of $10^{-4}$ to $10^{-6}$ Pa, the substrate is transferred in an oxygen and moisture extremely reduced atmosphere. Then, by preparatorily replacing the atmosphere in the chamber 115 (See FIG. 19) with an inert gas such as nitrogen gas ($N_2$) or argon gas (Ar) or forming a high vacuum of $10^{-4}$ to $10^{-6}$ Pa, the silicon substrate 71 is placed in an oxidation and nitriding use reaction tube kept in an oxygen and moisture extremely reduced atmosphere.

Figure 10A:
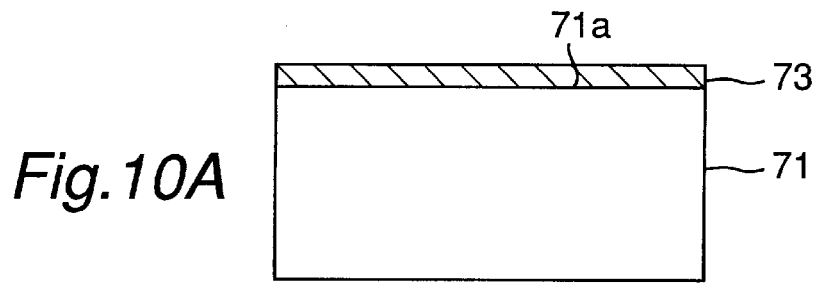
FIG. 10 is a view showing a forming process according to an eighth embodiment of the insulating film forming method of the present invention.

Next, the substrate is raised in temperature (corresponding to V1 in FIG. 18) in the above atmosphere. Through this process, the formation of a natural oxide film having a degraded film quality due to the oxidation in the temperature raising stage is suppressed and a silicon surface which is clean and free of any natural oxide film can be maintained. Since the intra-furnace temperature is not higher than 700° C., the surface of the silicon substrate 71 is not nitrided even in the nitrogen gas atmosphere. Subsequently, the wafer having the silicon surface which is clean and free of any natural oxide film is introduced into the oxidation and nitriding use reaction tube and is slowly oxidized at a temperature of 300 to 700° C. (H1 in FIG. 18), thereby forming an oxide film 73 (having a film thickness of 0.3 to 1 nm) as shown in FIG. 10A. Particularly, by executing this process at a low pressure of not greater than 1 Pa, the wafer can be lamellarly oxidized one atomic layer by one atomic layer. Further, by providing the oxidative gas by moisture vapor ($H_2O$), ozone ($O_3$) or these gases mixed with oxygen gas ($H_2O/O_2$, $O_3/O_2$), the oxygen atom generated from the $O_3$ molecule or $H_2O$ molecule itself is used as the oxide species having a smaller particle diameter than the $O_2$ molecule. By virtue of these oxygen species, the oxide film 73 obtained through the present oxidation process becomes dense and has an interfacial flatness as compared with the case where the film is formed by only oxygen molecules. Since the oxidizing rate is great in these atmospheres, it is better to execute the oxidation at a low pressure of not greater than 1 Pa for the lamellar oxidation. The oxide film 73 formed through the oxidation described as above has a small variation in film thickness and a smooth interface. With this arrangement, variations in film thickness and nitrogen density in the nitriding process as described later can be reduced.

Figure 10B:
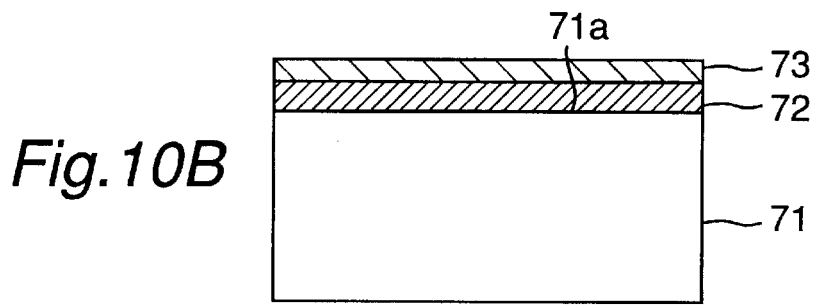
Figure 18:
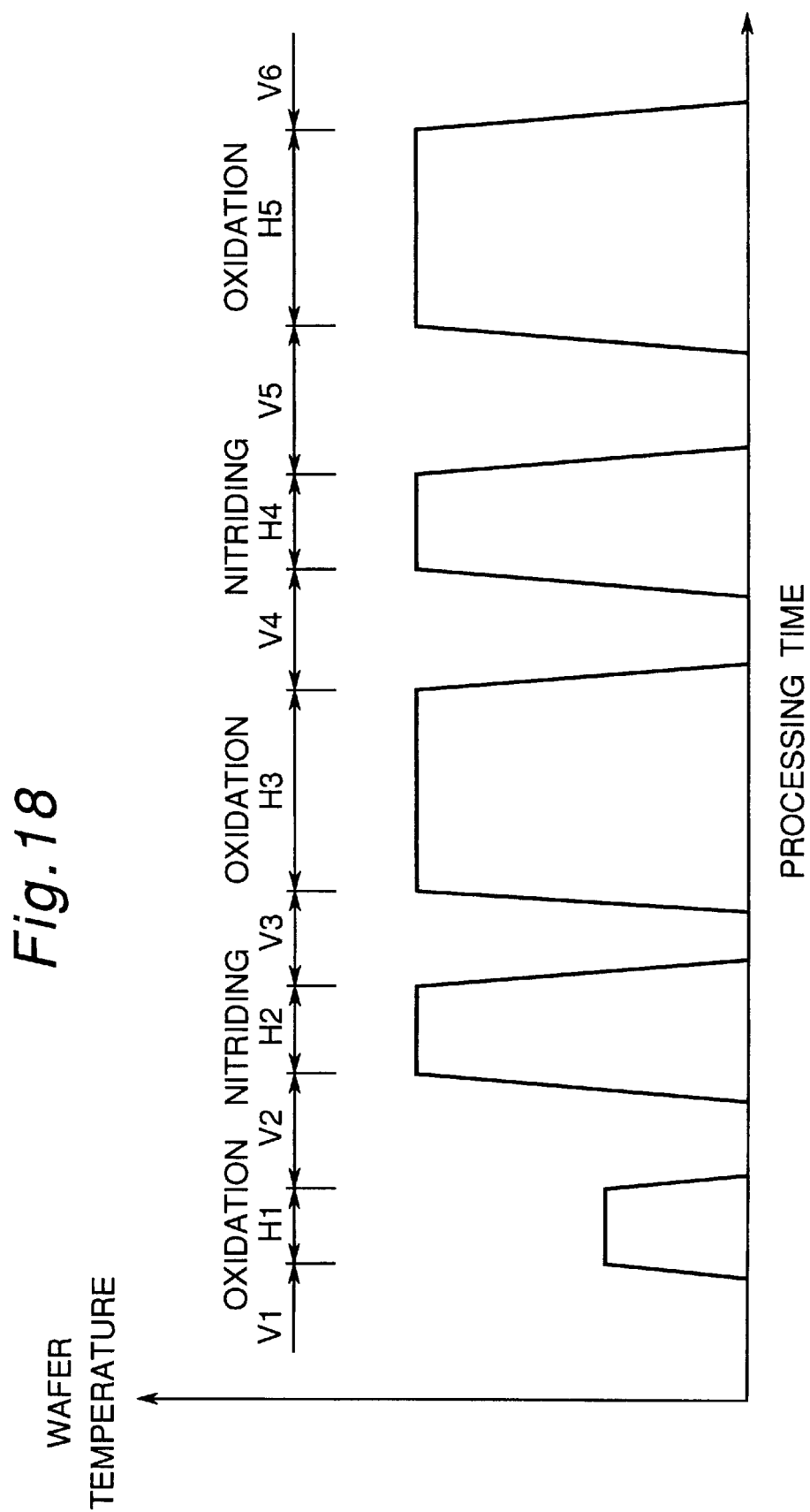
FIG. 18 is an explanatory graph of a heating cycle of the eighth embodiment of the insulating film forming method of the present invention.

Subsequent to this oxidation process, the atmosphere is replaced by an inert gas such as nitrogen gas ($N_2$) or argon gas (Ar), and thereby the substrate is lowered in temperature in an oxygen and moisture extremely reduced atmosphere, thereafter raised again in temperature by lamp heating (corresponding to V2 n FIG. 18). Through this process, even a slight oxidation is suppressed, and therefore, not only the subsequent variations in film thickness and nitrogen density can be reduced but also the inclusion of hydrogen atoms in the present insulating film are suppressed. Therefore, the possible occurrence of the deterioration of the device such as a surface state and an electron trap attributed to the hydrogen is also suppressed. Since the lamp heating system apparatus can raise or lower temperature in a short time, oxidation of the substrate and inclusion of hydrogen atoms into the substrate are further reduced. Subsequently, triallylamine or this mixed with an inert gas of nitrogen, argon or the like is introduced into the reaction tube at a temperature of 700 to 1150° C. (corresponding to H2 in FIG. 18). Through this process, a monoatomic nitrogen is generated by the thermal dissociation, so that a nitrided film 72 (having a film thickness of 0.5 to 3 nm) is formed in the vicinity of an interface 71a between the oxide film 73 and the silicon substrate 71 as shown in FIG. 10B. Since the lamp heating system apparatus can achieve a heat treatment in a short time, the film thickness and the nitrogen density of the nitrided film 72 are easy to be controlled. The variation in oxide film thickness is small and the interface 71a is smooth prior to the nitriding process, and therefore, the nitrided film 72 has small variations in film thickness and nitrogen density. In the case where only triallylamine is vaporized and introduced, the process is executed at a low pressure of not greater than 100 Pa. In this case, because of the low pressure, the dissociation of triallylamine is promoted and the monoatomic nitrogen has a long lifetime, allowing the nitriding to be efficiently executed. The elimination of organic matters that have been generated through the dissociating reaction of triallylamine and adhered to the wafer is also promoted.

Figure 10C:
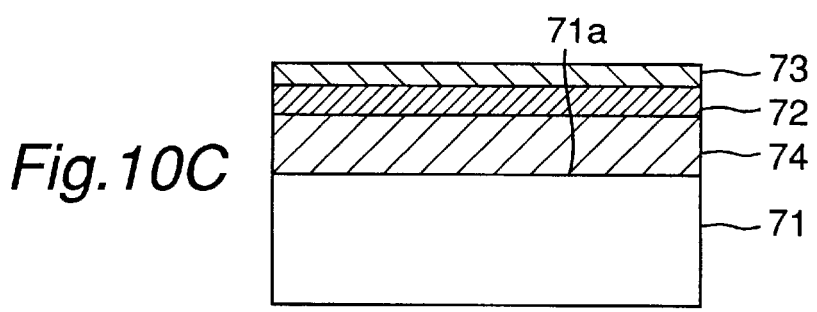

After completing this process, atmosphere is replaced by an inert gas such as nitrogen gas ($N_2$) or argon gas (Ar), and thereby the substrate is lowered in temperature (corresponding to V3 in FIG. 18) in an oxygen and moisture extremely reduced atmosphere and thereafter raised again in temperature by lamp heating system apparatus and oxidized at a temperature of 700 to 1000° C. (corresponding to H3 in FIG. 18). Through this process, an oxidized film 74 is formed as shown in FIG. 10C. In an attempt to prevent the diffusion of the oxide species from being influenced by the nitrogen atoms in a nitrided film 72, this oxidizing process must use moisture vapor ($H_2O$) or atomic oxygen (O) having a great diffusion coefficient. However, according to the oxidizing process with moisture vapor, a great quantity of electron traps are formed at the interface on the substrate side, which is disadvantageous in terms of the long-term reliability of the device. Since the atomic oxygen can be generated by dissociating ozone ($O_3$), the oxidizing process is executed in an atmosphere of ozone ($O_3$) or this mixed with oxygen gas ($O_3/O_2$). The oxidizing rate is great in these atmospheres, however, the thin oxidized film 74 is formed at a low pressure of not greater than 1 Pa in order to improve the film thickness controllability by reducing the oxidizing rate without reducing the diffusion coefficient of the oxide species. In this case, the oxidation can be executed at a relatively low temperature by virtue of the use of ozone for the oxidation, and therefore, the redistribution of the nitrogen density profile is hard to occur. Since the lamp heating system apparatus can achieve oxidation in a short time at an elevated temperature, the diffusion coefficient of the oxide species can be further increased, so that the diffusion of the oxide species is not influenced by the nitrogen atoms. In order to obtain the desired total insulating film thickness, the pressure and time are mainly adjusted in this oxidation process. Through the present oxidation process, a small quantity of dangling bonds of nitrogen atoms in the nitrided film 72 results, so that electron traps and Poole-Frenkel current can be reduced.

Figure 10D:
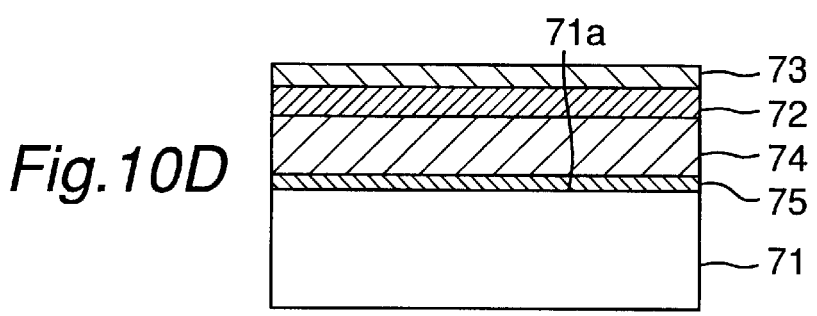

After this oxidation process, the atmosphere is replaced by an inert gas such as nitrogen gas ($N_2$) or argon gas (Ar), and thereby the substrate is lowered in temperature by air-cooling and then raised again in temperature by lamp heating (corresponding to V4 in FIG. 18) in an oxygen and moisture extremely reduced atmosphere. Triallylamine or this mixed with inert gas of nitrogen, argon or the like is introduced into the reaction tube at a temperature of 700 to 1150° C. (corresponding to H4 in FIG. 18). Through this process, a monoatomic nitrogen is generated by the thermal dissociation, so that a nitrided film 75 (having a film thickness of 0.5 to 3 nm) is formed in the vicinity of an interface 71a between the oxide film 74 and the silicon substrate 71 as shown in FIG. 10D.

The film thickness of the nitrided film 75 is adjusted so that a stress at the interface between the insulating film and the silicon substrate 71 is suitable and the increase of hole traps and the reduction in carrier mobility are suppressed. Since the lamp heating system apparatus can achieve a heat treatment in a short time, the film thickness and the nitrogen density of the nitrided film 75 are easy to be controlled. Since the variation in film thickness of the entire insulating film is small and the interface is smooth prior to the nitriding, the variations in the thickness and the nitrogen density of the nitrided film 75 are small. In the case where only triallylamine is vaporized and introduced, this process is executed at a low pressure of not greater than 100 Pa. In this case, because of the low pressure, the dissociation of triallylamine is promoted and the monoatomic nitrogen has a long lifetime, allowing the nitriding to be efficiently executed. Furthermore, elimination of an organic matter which is produced through the dissociating reaction of triallylamine and adhered to the wafer is also promoted.

Figure 10E:
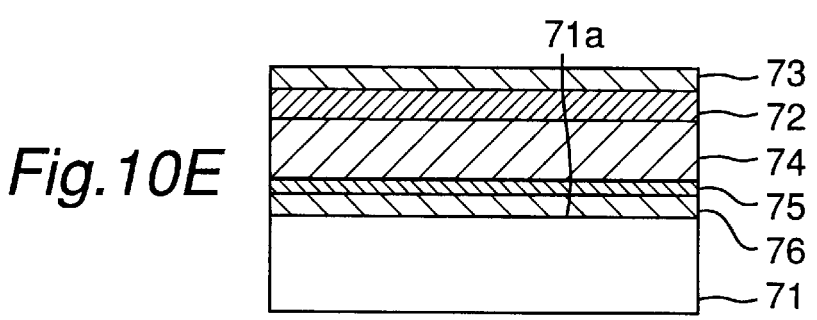

After completing this process, the atmosphere is replaced by an inert gas such as nitrogen gas ($N_2$) or argon gas (Ar), and thereby the substrate is lowered in temperature by air-cooling and then raised again in temperature by lamp heating (corresponding to V5 in FIG. 18) in an oxygen and moisture extremely reduced atmosphere and then re-oxidized at a temperature of 700 to 1000° C. (corresponding to H5 in FIG. 18). Through this process, an oxidized film 76 (having a film thickness of 1 to 5 nm) is formed as shown in FIG. 10E.

In an attempt to prevent the diffusion of the oxide species from being influenced by the nitrogen atoms in the nitrided films 72 and 75, this re-oxidizing process must use moisture vapor ($H_2O$) or atomic oxygen (O) having a great diffusion coefficient. However, according to the re-oxidizing process with moisture vapor, a great quantity of electron traps are formed at the interface on the substrate side, which is disadvantageous in terms of the long-term reliability of the device. Since the atomic oxygen can be generated by dissociating ozone ($O_3$), it is better to execute the re-oxidizing process in an atmosphere of ozone ($O_3$) or this mixed with an oxygen gas ($O_3/O_2$).5 The oxidizing rate is great in these atmospheres, however, the thin oxidized film 76 is formed at a low pressure of not greater than 1 Pa in order to improve the film thickness controllability by reducing the oxidizing rate without reducing the diffusion coefficient of the oxide species. In this case, the oxidation can be achieved at a relatively low temperature since the oxidation is executed with not oxygen but ozone, and therefore, the redistribution of the nitrogen density profile is hard to occur. Since the lamp heating system apparatus can achieve oxidation in a short time at an elevated temperature, the diffusion coefficient of the oxide species can be further increased, so that the diffusion of the oxide species is not influenced by the nitrogen atoms. Through the present oxidation, a small quantity of dangling bonds of nitrogen atoms in the nitrided film 75 results, so that electron traps and Poole-Frenkel current can be reduced. Furthermore, an interface 71a between the insulating film and the silicon substrate 71 is made to have a structure similar to that of the Si/$SiO_2$ interface, so that the surface states can be reduced and the problems attended by the nitriding process such as the increase of hole traps attributed to the change in strain on the interface 71a and the chemical species concerned with nitrogen such as $Si_2$=NH, or the reduction in carrier mobility in the region where an electric field is low in a direction perpendicular to the MOS interface can be solved. The film thickness of the oxidized film 76 is appropriate for causing this effect.

After this oxidation, the atmosphere is replaced by an inert gas such as nitrogen gas or argon gas, and thereby the substrate is lowered in temperature (corresponding to V6 of FIG. 18) in an oxygen and moisture extremely reduced atmosphere. The insulating film formation is completed through the above processes.

According to the present embodiment, an insulating film having the nitrided films 72 and 75 between the oxide film 73 and the oxidized films 74 and 76 can be formed on the silicon substrate 71. In the present embodiment, a small quantity of hydrogen exists in the nitrided film differently from the nitriding by ammonia, and therefore, a small quantity of electron traps and surface states result. Further, when oxy-nitriding the film with a compound gas atmosphere of nitrogen and oxygen such as $N_2O$, the oxidation and nitriding simultaneously progress. Therefore, the film thickness and the nitrogen density in the film are hard to be independently controlled, and the nitrogen density is also hard to be increased. In contrast to this, according to the present insulating film forming method, the oxidation and nitriding can be independently executed, and therefore, the film thickness and the nitrogen density can be independently controlled, and the nitrogen density can be increased. Furthermore, according to the present insulating film structure, the diffusion of boron and hydrogen from the gate side to the substrate is suppressed by the existence of the nitrided films 72 and 76, and therefore, the extension of the deterioration of the device due to so-called the "penetration of boron" and the hot carrier attributed to the moisture in the interlayer silicon oxide film can be prevented. Particularly in the present insulating film structure, the nitrogen density in the nitrided film 75 is made relatively small as compared with that of the nitrided film 72, and the oxidized film 76 is formed between the nitrided film 75 and the silicon substrate 71. With this arrangement, not only the above problems can be effectively solved but also the problems attended by the oxy-nitriding process such as the increase of hole traps attributed to the change in strain on the $Si/SiO_2$ interface and the chemical species concerned with nitrogen such as $Si_2$=NH, or the reduction in carrier mobility in the region where an electric field is low in a direction perpendicular to the MOS interface can be solved. Furthermore, there are small variations in film thickness and nitrogen density by means of the forming method of the present embodiment, and therefore, a satisfactory dielectric breakdown characteristic can be obtained.

It is to be noted that the nitrided films of the seventh and eighth embodiments are not limited to those having two layers, and it is acceptable to provide more layers of the oxidized film/nitrided film/oxidized film. With this multilayer arrangement, the diffusion of boron and hydrogen from the gate to the substrate can be further suppressed.

Furthermore, the gas of molecules containing nitrogen of the first through eighth embodiments is not limited to triallylamine. The gas is allowed to be a gas of a compound which includes neither oxygen atom nor bond between a nitrogen atom and a hydrogen atom (N—H) and dissociates at an elevated temperature to generate a monatomic nitrogen, as exemplified by azide. It is preferable to use azide that is not an alkaline salt, e.g., ethylazide ($C_2H_5N_3$) in terms of the reduction of mobile charges in the insulating film.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An insulating film forming method on a silicon substrate by means of a gas of molecules containing at least nitrogen, said gas of molecules containing nitrogen being a compound which includes no oxygen atom and has no bond between a nitrogen atom and a hydrogen atom and being a gas which generates monoatomic nitrogen when it dissociates.

2. An insulating film forming method as claimed in claim 1, wherein said gas of molecules containing nitrogen is at least either amine or azide.

3. An insulating film forming method as claimed in claim 2, wherein said amine is triallylamine.

4. An insulating film forming method as claimed in claim 2, wherein said azide is ethylazide.

5. An insulating film forming method as claimed in claim 1, wherein said gas of molecules containing nitrogen is used at a reduced pressure.

6. An insulating film forming method as claimed in claim 1, wherein said gas of molecules containing nitrogen is liquid at normal temperature and normal pressure and is supplied by bubbling an inert gas in said liquid.

7. An insulating film forming method as claimed in claim 1, wherein a nitride film is formed on the silicon substrate by means of said gas of molecules containing nitrogen and thereafter thermally treated in an atmosphere including an oxidative gas.

8. An insulating film forming method as claimed in claim 1, wherein an oxide film is formed by oxidizing a surface of the silicon substrate and thereafter thermally treated in an atmosphere including said gas of molecules containing nitrogen.

* * * * *